US009601448B2

(12) United States Patent
Tatsumi

(10) Patent No.: US 9,601,448 B2
(45) Date of Patent: Mar. 21, 2017

(54) ELECTRODE CONNECTION STRUCTURE AND ELECTRODE CONNECTION METHOD

(71) Applicant: Waseda University, Tokyo (JP)

(72) Inventor: Kohei Tatsumi, Tokyo (JP)

(73) Assignee: WASEDA UNIVERSITY, Tokyo (JP)

( * ) Notice: Subject to any disclaimer, the term of this patent is extended or adjusted under 35 U.S.C. 154(b) by 0 days.

(21) Appl. No.: 15/094,759

(22) Filed: Apr. 8, 2016

(65) Prior Publication Data

US 2016/0225730 A1    Aug. 4, 2016

Related U.S. Application Data

(63) Continuation-in-part of application No. PCT/JP2014/077040, filed on Oct. 9, 2014.

(30) Foreign Application Priority Data

Oct. 9, 2013 (JP) ................. 2013-212166

(51) Int. Cl.
  *H01L 23/48*  (2006.01)
  *H01L 21/44*  (2006.01)
  (Continued)

(52) U.S. Cl.
  CPC .............. *H01L 24/10* (2013.01); *H01L 21/52* (2013.01); *H01L 23/49816* (2013.01); *H01L 23/49827* (2013.01); *H01L 23/49838* (2013.01); *H01L 24/03* (2013.01); *H01L 24/13* (2013.01); *H01L 24/16* (2013.01); *H01L 24/24* (2013.01); *H01L 24/29* (2013.01); *H01L 24/32* (2013.01); *H01L 24/40* (2013.01); *H01L 24/48* (2013.01);
  (Continued)

(58) Field of Classification Search
  CPC ..................................... H01L 24/10

USPC ......... 257/737–739, 773, 780; 438/613–615, 438/666
See application file for complete search history.

(56) References Cited

U.S. PATENT DOCUMENTS

| | | | | |
|---|---|---|---|---|
| 6,042,894 A | * | 3/2000 | Goto | .......................... C08J 7/04 427/504 |
| 7,936,568 B2 | * | 5/2011 | Mashino | ................ H01G 4/236 361/766 |
| 2002/0011657 A1 | | 1/2002 | Saito | |

FOREIGN PATENT DOCUMENTS

| EP | 1 069 213 A2 | 1/2001 |
|---|---|---|
| JP | H06-140559 A | 5/1994 |

(Continued)

OTHER PUBLICATIONS

International Search Report issued in Application No. PCT/JP2014/077040, mailed Jan. 13, 2015.

*Primary Examiner* — Calvin Lee
(74) *Attorney, Agent, or Firm* — Michael Best & Friedrich LLP

(57) ABSTRACT

An electrode connection structure includes: a first electrode of an electrical circuit; and a second electrode of the electrical circuit that is electrically connected to the first electrode. The first and second electrodes are oppositely disposed in direct or indirect contact with each other. A plated lamination is substantially uniformly formed by plating process from a surface of a contact region and opposed surfaces of the first and second electrodes. A void near the surface of the contact region is filled by formation of the plated lamination. Portions of the plated lamination formed from the opposed surfaces of the first and second electrodes in a region other than the contact region are not joined together.

18 Claims, 17 Drawing Sheets

(51) Int. Cl.
  *H01L 23/00* (2006.01)
  *H01L 21/52* (2006.01)
  *H01L 23/498* (2006.01)

(52) U.S. Cl.
  CPC .............. *H01L 24/73* (2013.01); *H01L 24/75* (2013.01); *H01L 24/76* (2013.01); *H01L 24/81* (2013.01); *H01L 24/82* (2013.01); *H01L 24/83* (2013.01); *H01L 24/84* (2013.01); *H01L 24/85* (2013.01); *H01L 24/05* (2013.01); *H01L 24/11* (2013.01); *H01L 24/37* (2013.01); *H01L 24/45* (2013.01); *H01L 2224/0345* (2013.01); *H01L 2224/03464* (2013.01); *H01L 2224/04* (2013.01); *H01L 2224/0401* (2013.01); *H01L 2224/04026* (2013.01); *H01L 2224/04042* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05164* (2013.01); *H01L 2224/05166* (2013.01); *H01L 2224/05173* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05673* (2013.01); *H01L 2224/1134* (2013.01); *H01L 2224/11334* (2013.01); *H01L 2224/136* (2013.01); *H01L 2224/13012* (2013.01); *H01L 2224/13017* (2013.01); *H01L 2224/13139* (2013.01); *H01L 2224/13144* (2013.01); *H01L 2224/13147* (2013.01); *H01L 2224/13155* (2013.01); *H01L 2224/13294* (2013.01); *H01L 2224/13339* (2013.01); *H01L 2224/13344* (2013.01); *H01L 2224/13347* (2013.01); *H01L 2224/13355* (2013.01); *H01L 2224/13411* (2013.01); *H01L 2224/13611* (2013.01); *H01L 2224/16225* (2013.01); *H01L 2224/16227* (2013.01); *H01L 2224/16245* (2013.01); *H01L 2224/245* (2013.01); *H01L 2224/2499* (2013.01); *H01L 2224/24225* (2013.01); *H01L 2224/24245* (2013.01); *H01L 2224/29012* (2013.01); *H01L 2224/29017* (2013.01); *H01L 2224/29147* (2013.01); *H01L 2224/32227* (2013.01); *H01L 2224/32245* (2013.01); *H01L 2224/3716* (2013.01); *H01L 2224/37147* (2013.01); *H01L 2224/40095* (2013.01); *H01L 2224/40227* (2013.01); *H01L 2224/40991* (2013.01); *H01L 2224/40996* (2013.01); *H01L 2224/45147* (2013.01); *H01L 2224/48091* (2013.01); *H01L 2224/48227* (2013.01); *H01L 2224/48472* (2013.01); *H01L 2224/48839* (2013.01); *H01L 2224/48844* (2013.01); *H01L 2224/48847* (2013.01); *H01L 2224/48855* (2013.01); *H01L 2224/48864* (2013.01); *H01L 2224/48873* (2013.01); *H01L 2224/48991* (2013.01); *H01L 2224/48996* (2013.01); *H01L 2224/73255* (2013.01); *H01L 2224/73265* (2013.01); *H01L 2224/73273* (2013.01); *H01L 2224/73277* (2013.01); *H01L 2224/75754* (2013.01); *H01L 2224/76754* (2013.01); *H01L 2224/81002* (2013.01); *H01L 2224/8184* (2013.01); *H01L 2224/8192* (2013.01); *H01L 2224/81205* (2013.01); *H01L 2224/81439* (2013.01); *H01L 2224/81444* (2013.01); *H01L 2224/81447* (2013.01); *H01L 2224/81455* (2013.01); *H01L 2224/81464* (2013.01); *H01L 2224/81473* (2013.01); *H01L 2224/81815* (2013.01); *H01L 2224/81901* (2013.01); *H01L 2224/82002* (2013.01); *H01L 2224/82101* (2013.01); *H01L 2224/82399* (2013.01); *H01L 2224/83002* (2013.01); *H01L 2224/8384* (2013.01); *H01L 2224/8392* (2013.01); *H01L 2224/83439* (2013.01); *H01L 2224/83444* (2013.01); *H01L 2224/83447* (2013.01); *H01L 2224/83455* (2013.01); *H01L 2224/83464* (2013.01); *H01L 2224/83473* (2013.01); *H01L 2224/83815* (2013.01); *H01L 2224/83901* (2013.01); *H01L 2224/8492* (2013.01); *H01L 2224/8592* (2013.01); *H01L 2224/85205* (2013.01); *H01L 2224/85447* (2013.01); *H01L 2224/9201* (2013.01); *H01L 2924/00011* (2013.01); *H01L 2924/3656* (2013.01)

(56) References Cited

FOREIGN PATENT DOCUMENTS

| JP | 1997/082759 | * | 3/1997 | ............. H01L 21/60 |
|----|-------------|---|--------|--------------------------|
| JP | 2001-085437 | A | 3/2001 | |
| JP | 2001-332644 | A | 11/2001 | |
| JP | 2004-288721 | A | 10/2004 | |
| JP | 2007-048990 | A | 2/2007 | |
| JP | 2007-335473 | A | 12/2007 | |

* cited by examiner

FIG. 2A     (Diameter: 172 μm φ)
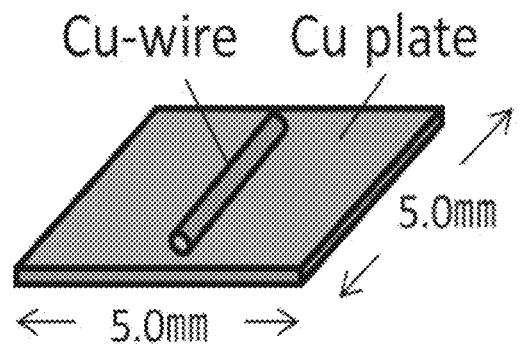
Copper wire bonded to plate
FIG. 2B
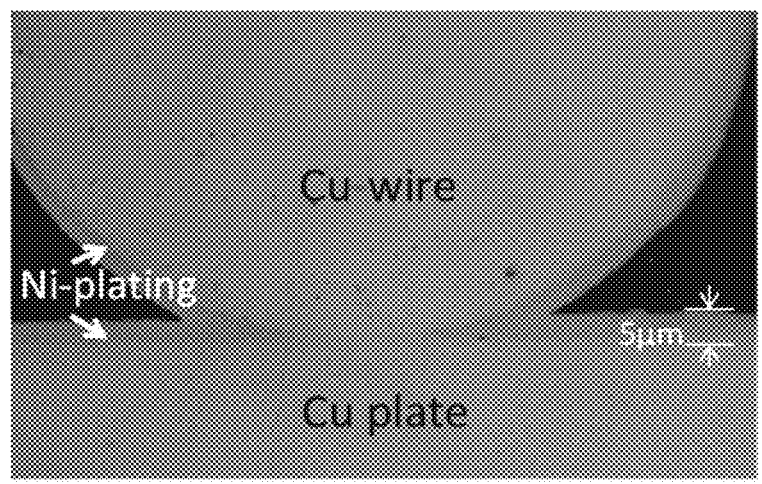

Silicon chip
bonded to lead frame

Set a maximum of this region as nearby region

Set a maximum of this region as nearby region

Set angle θ between first contact part 100 and second contact part 200 ≦ 15 degrees Plate-process at least a region with angle θ between first contact part 100 (electrode plane) and second contact part 200 (ball bump periphery tangent line) ≦ 15 degrees Blacked-out portions have the same crystal orientations and have orientation difference of not more than 15 degrees. Such a region is set not less than 50 % of entire interface.

ELECTRODE CONNECTION STRUCTURE AND ELECTRODE CONNECTION METHOD

CROSS REFERENCE TO RELATED APPLICATIONS

This application is a continuation in-part of International Patent Application No. PCT/JP2014/077040, filed on Oct. 9, 2014, now pending, the contents of which, including the specification, the claims and the drawings, are incorporated herein by reference in their entirety. International Patent Application No. PCT/JP2014/077040 is entitled to the benefit of Japanese Patent Application No. 2013-212166, filed on Oct. 9, 2013, the contents of which, including the specification, the claims and the drawings, are incorporated herein by reference in their entirety.

BACKGROUND ART

Technical Field

The present invention relates to an electrode connection method of electrically connecting electrodes of an electric circuit by plating. The present invention also relates to an electrode connection structure formed using the same.

As a technique for connecting electrodes, low melting point solder has been widely used. On the other hand, a power semiconductor using material such as silicon carbide (SiC) does not have sufficient heat resistance. Further, even in the connection of solar panels which are operated at a relatively high temperature over a long period, for example, when the connection by soldering is used, it does not have sufficient long-term durability nor heat resistance in the case of operation at relatively high temperatures although they are not used at temperatures exceeding the melting point. Other than the connection by soldering, techniques such as ultrasonic bonding, brazing, and welding are known as a technique for connecting high-melting point materials, for example. In the case of ultrasonic bonding, stress loading is large and an object to be joined is limited. In the case of brazing and welding, since a body to be connected is heated to a high temperature, both are not suitable for electronic components. Furthermore, characteristic deterioration of steel and non-ferrous material by their structure changes at high temperatures can be a problem. Therefore, a high heat-resistance connection technology which can make connection at relatively low temperatures and allows the use of the connection at high temperatures, is required.

With respect to the connection of electronic components, techniques for connecting

SUMMARY OF INVENTION

It is an object of the present invention to provide an electrode connection structure and an electrode connection method which are capable of making adhesive connection without gaps.

The electrode connection structure of the present invention includes a first electrode of an electrical circuit; and a second electrode of the electrical circuit that is electrically connected to the first electrode. The first and second electrodes are oppositely disposed in direct or indirect contact with each other on an at least one contact region. A plated lamination is substantially uniformly formed by plating process from a surface of a contact region and opposed surfaces of the first and second electrodes. A void near the surface of the contact region may be filled by formation of the plated lamination. Portions of the plated lamination formed on the opposed surfaces of the first and second electrodes in a region other than the contact region are separated. The region other than the contact region consists only of the plated lamination and does not contain a void.

The electrode connection method for forming the above-mentioned electrode connection structure includes: placing at least portions of the first and second electrodes in direct or indirect contact with each other on an at least one contact region; plating a periphery of the contact region and the first and second electrodes in a state where a plating solution is circulated in the periphery of the contact region; and stopping the plating process, in a state where a plated lamination surface nearest to the contact region is in contact with the plating solution, before a void shielded by a surface of the plated lamination formed on the respective first and second electrodes occurs.

BRIEF DESCRIPTION OF DRAWINGS

FIG. 2A is a diagram showing a result of an experiment assuming junction of a chip electrode with a lead wire in the first embodiment of the present invention, in particular showing an outline of the experiment. FIG. 2B is a diagram showing a cross-sectional view of a junction of a Cu plate with a Cu wire in the result of the experiment of FIG. 2A.

DESCRIPTION OF EMBODIMENTS

Figure 1:
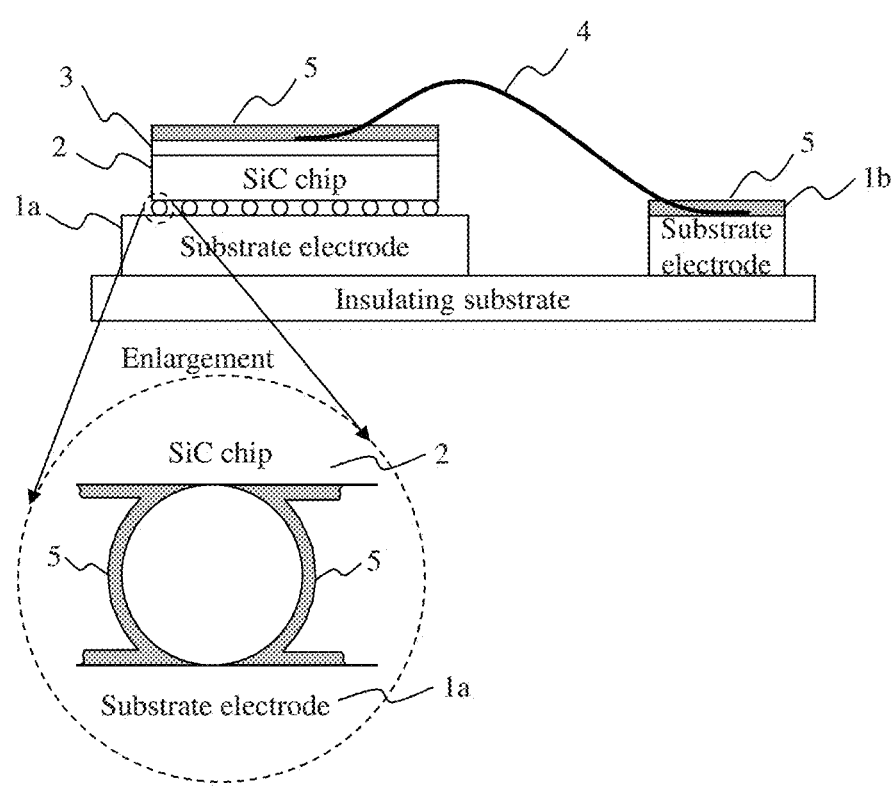
FIG. 1 is a diagram showing a plate-processed portion in an electrode connection structure according to a first embodiment of the present invention.

Hereinafter, embodiments of the present invention will be described. The same reference numerals are given to the same elements throughout the entire embodiments.

First Embodiment

An electrode connection method and an electrode connection structure according to the present embodiment will be described with reference to FIG. 1 to FIG. 5C. The electrode connection method according to the present invention is an interconnection method using a metal(s) with a high melting point or an alloy(s) thereof (in the following embodiments, mainly nickel, referred to as Ni). As the property of Ni, it is known that its melting point is as high as 1455° C. and it has high corrosion resistance. By performing Ni plating, it is possible to realize such a connection that can withstand a high temperature environment. Further, the electrode connection structure according to the present embodiment is an electrode connection structure produced by the electrode connection method as described below.

In order to reduce the size and increase the efficiency of an electric power converter mounted on a hybrid vehicle or an electric vehicle, research and development on a method of increasing power density by using a technique such as SiC devices has been promoted.

As a result, there is an increasing demand for an advanced heat-resistant mounting technology. In the present embodiment, covering a connection between two electrodes with plating metal makes it possible to simultaneously perform two types of connection, that is, (1) connection between a device electrode and a substrate terminal, and (2) die-bonding connection.

FIG. 1 is a diagram showing a plate-processed portion in an electrode connection structure and by an electrode connection method according to the present embodiment. In FIG. 1, a substrate electrode 1$a$ and a backside electrode of a SiC chip 2 are connected in a laminated state by die bonding (through a conductive terminal in the form of a ball bump or a wire). A substrate electrode 1$b$ and a pad 3 of the SiC chip 2 are also connected by a lead wire 4. Each surface of the connected portions is subjected to Ni plating, and each connected portion is covered with Ni plated layer 5. In the present embodiment, high-temperature resistant connection is realized by joining the connected portion between the lead wire and the pad, and the connected portion between the chip and substrate, using Ni plating.

FIG. 2A and FIG. 2B are diagrams showing a result of an experiment assuming junction of a chip electrode with a lead wire. As shown in FIG. 2A, copper (Cu) was mainly used as a material of a substrate and the lead wire, and a Cu wire (diameter: 172 μm) was bonded to a Cu plate of 5.0 mm×5.0 mm by electrolytic Ni plating. Conditions at that time were as follows: bath temperature was 50° C.; current density was set to 5 A/dm$^2$; growth rate of Cu plating on a flat plate was about 0.83 μm/min. Cu has good electrical conductivity and is rich in workability, and it is easy to be pretreated compared to metal such as Al. Further, Cu—Ni alloy is an all proportional solid solution and can be expected to have connection reliability at high temperatures. FIG. 2B shows a cross section of a junction between the Cu plate and the Cu wire. As shown in FIG. 2B, there is no defect such as a void which could be a problem by Ni plating, and the Cu plate and the Cu wire were joined with good adhesion.

Figure 3A:
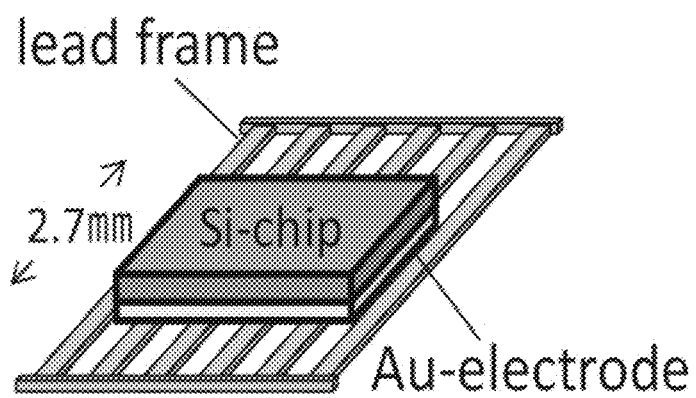
FIG. 3A is a diagram showing a result of an experiment assuming die bonding in the first embodiment of the present invention, in particular showing an outline of the experiment.
Figure 3B:
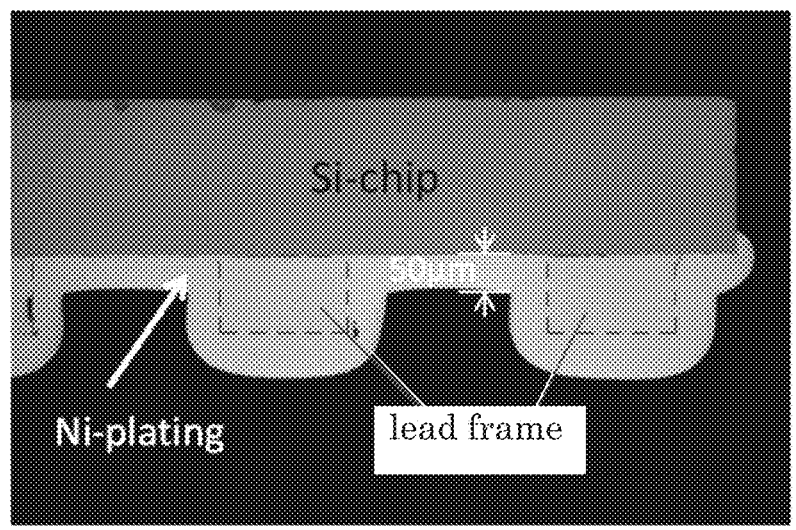
FIG. 3B is a diagram showing a cross-sectional view of a junction of a chip with a lead frame in the result of the experiment of FIG. 3A.

FIG. 3A and FIG. 3B are diagrams showing a result of an experiment assuming die bonding. As shown in FIG. 3A, a gold (Au) deposition surface of an Au deposition Si chip was contacted with a lead frame having a length of 2.7 mm and arranged in the form of strips, and then Ni plating was performed. FIG. 3B shows a cross section of a junction between the chip and the lead frame. Again, as shown in FIG. 3B, there was no defect such as a void which could be a problem, and the chip and the lead frame were joined with good adhesion, as is the case with FIG. 2A and FIG. 2B.

As can be seen from the experimental results of FIG. 2A to FIG. 3B, it is possible to form a junction having no defect such as a void, by placing at least portions of objects to be connected (the Cu wire and the Cu plate in the case of FIG. 2; the backside electrode and the lead frame of the chip in the case of FIG. 3). which will be targets of connection, in contact with each other, and by sufficiently circulating a plating solution around the contact portions.

In particular, as shown in FIG. 2, since the plating solution sufficiently circulates around the contact portions of the objects to be connected by performing plating process in a state where the objects to be connected are linearly in contact with each other, it is possible to form a high-quality junction having less defect such as a void. Similarly, although not shown in the experiments of FIG. 2A to FIG. 3B, when the chip and the substrate are bonded with a ball bump, contact places will be point-like, and then the plating solution will sufficiently circulate around the contact portions of the objects to be connected. Therefore, the plating process proceeds around the contact portions, it is possible to form a high-quality junction having no defect such as a void.

Figure 4A:
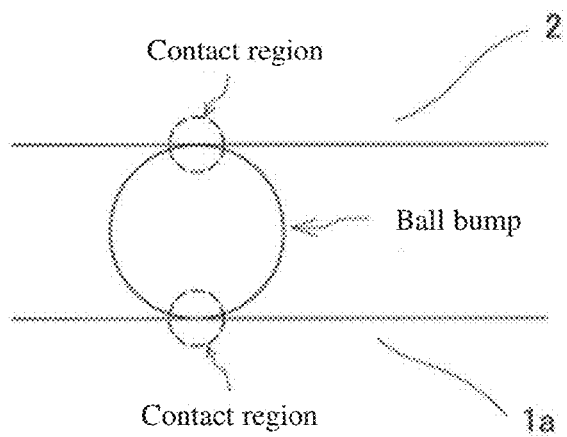
FIG. 4A is a diagram showing one state of a plating process in the case of joining a substrate electrode and a SiC chip backside electrode by plating in the first embodiment of the present invention.
Figure 4B:
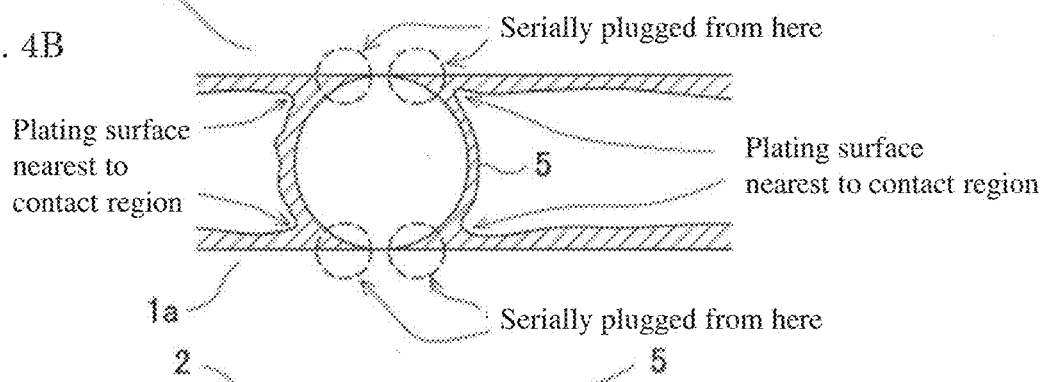
FIG. 4B is a diagram showing one state following FIG. 4A.
Figure 4C:
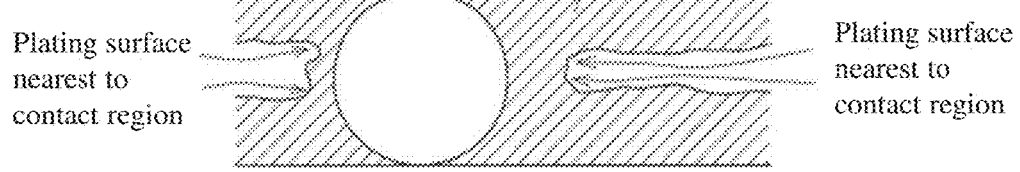
FIG. 4C is a diagram showing one state following FIG. 4B.
Figure 4D:
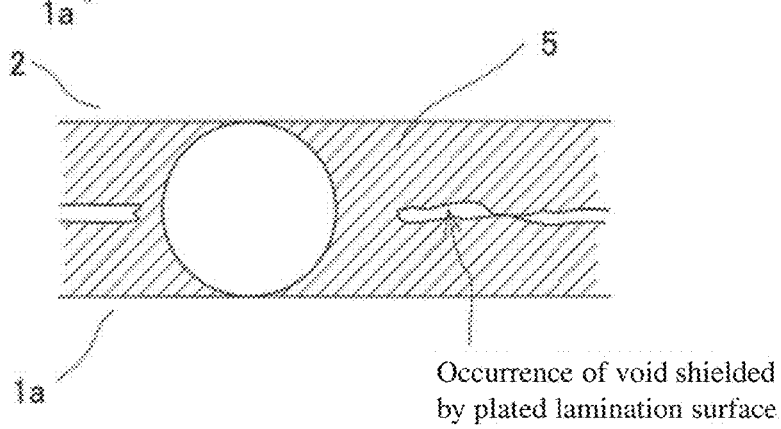
FIG. 4D is a diagram showing one state following FIG. 4C.

The above-mentioned plating process will be described in more detail. FIG. 4A to FIG. 4D are diagrams showing a plating process in the case of bonding the substrate electrode and the SiC chip backside electrode by plating. FIG. 4A shows a state before starting the plating process. FIG. 4B, FIG. 4C, and FIG. 4D show respective states where the plating process proceeds in the order.

In FIG. 4A, the substrate electrode 1$a$ and the backside electrode of the SiC chip 2 are oppositely disposed in indirect contact with each other through a circular arc portion (convex portion) of the ball bump. When under this state the object is immersed in the plating solution to start the plating process, the plating is serially plugged from a contact region surface of the convex portion and opposed surfaces of the electrodes, as shown in FIG. 4B. Then, by maintaining this state, the plating process proceeds as shown in FIG. 4C. In FIG. 4B and FIG. 4C, the plating is serially plugged into the Ni plating layer 5 from the region near the contact region surface of the convex portion, and space (or gap) is filled.

In the present embodiment, the plating process is stopped in the state of FIG. 4B or FIG. 4C. That is, it is necessary to stop the plating process, in a state where a plated lamination surface nearest to the contact region surface is in contact with the plating solution, and before a void shielded by the plated lamination surface occurs. If the plating process was continued, portions of the Ni plating layer 5 formed into lamination from opposed surfaces of the electrodes would be joined together to create a void because the plating process substantially uniformly proceeds as a whole but it is not necessarily uniform in the microscopic sense, as shown in FIG. 4D. If such shielded void was created, it would be impossible to wash away the plating solution, which would then remain inside, thus causing corrosion. Further, when a heating process is performed, the residual plating solution would expand and become high-pressure, which could lead to a damage of the plated layer. Therefore, in order to form a high-quality Ni plating layer 5, it is very important to stop the plating process in the state as shown in FIG. 4B or FIG. 4C.

With respect to a specific process of stopping the plating process, an immersion time in the plating solution may be adjusted (speed adjustment of a manufacturing line, for example) based on a result of previously conducted preliminary experiments, or the immersion time may be adjusted in real time while measuring a thickness of the plated layer.

By performing the Ni plating in the state where the object to be connected are in contact with each other as described above, the object to be connected will be with the same electrical potential and it is possible to perform a substantially uniform plating process. Further, it is possible to form a junction having no defect such as a void by Ni-plating the objects to be connected in their linear or point-like contact with each other, as described above. The size of the line or point at that time may be specified by a percentage of a region to be plate-processed. In particular, in the case of FIG. 3A and FIG. 3B, the objects to be connected appear to be in planar contact with each other when viewed microscopically, but they are in linear contact with each other when viewed macroscopically. Therefore, it is sometimes better to specify the size of the contact portions by the percentage of the region to be plate-processed. For example, it is preferable that the ratio of the contact portions to the size of the entire electrode is not greater than ½, more preferably not greater than ⅕. That is, by making an area of non-plated connections, in which microscopically the plating solution cannot be circulated between the contact portions, smaller than that of connections to be connected by plating metal of non-contact portions between the electrodes, it is possible to connect electrodes, keeping sufficient electrical conductivity and thermal conductivity which are typically required.

Thus, in the electrode connection method according to the present embodiment, at least portions of electrodes of an electrical circuit, which are electrically connected, are placed in contact (in particular, in point-like or linear contact) with each other, and then the electrodes are connected by plating therebetween in a state where a plating solution is circulated in a periphery of the contact portions. Therefore, the plating spreads around the contact portions and it is possible to make adhesive connection without gaps. Further, since a junction is covered by Ni plating, it is possible to operate normally even under high-temperature conditions and it is also possible to improve corrosion resistance.

Incidentally, the above-described plating process may be conducted using Cu or a Cu alloy(s), Au or an Au alloy(s), silver (Ag) or an Ag alloy(s), or palladium (Pd) or a Pd alloy(s), which each has a melting point of at least 700° C. or higher, in addition to Ni or a Ni alloy(s). Further, a material of the surface of the electrodes of the objects to be connected may be Ni or a Ni alloy(s), Cu or a Cu alloy(s), Au or an Au alloy(s), Ag or an Ag alloy(s), or Pd or a Pd alloy(s).

With respect to the combination of a plating solution type, a chip electrode surface, and a substrate electrode surface, each combination as described above is suitable. In particular, with respect to Ni plating or Ni alloy plating, if the main component of the surface metal is Cu, Pd, Ni, Au, rhodium (Rh), or Ag, it has the same type of crystal structure as the plating metal has when used at a high temperature. Therefore, voids due to specific phases and intermetallic compounds which may cause deterioration, are hardly formed in the interface even when the connection is used at a high temperature for a long period of time. Further, with respect to Cu plating or Cu alloy plating, the main component of the surface metal is preferably Cu, Ni, Pd, Au, Rd, or Ag. Furthermore, with respect to Pd plating or Pd alloy plating, the main component of the surface metal is preferably Pd, Cu, Ni, Au, Rd, or Ag.

Further, when connecting the electrodes of the objects to be connected by the above-mentioned plating process, it may be performed in a state where the semiconductor chip electrode and the substrate electrode are in direct contact with each other, in a state where they are in indirect contact with each other through a lead wire, or in a state where they are in indirect contact with each other through a spherical or hemispherical conductive terminal. By doing so, the contact portions can be held in a point-like or linear manner and it is possible to make adhesive connection without gaps.

Furthermore, the object to be connected may be a Si semiconductor, a GaN semiconductor, or an LED chip, in addition to the SiC chip 2. By doing so, it is possible to normally operate high-temperature resistant devices at high temperature conditions using the above connection technology. Further, in a power semiconductor and a solar cell Si solder semiconductor, the above connection technology is also suitable for devices used in moderate high temperatures for a long period of time.

Furthermore, after the above plating process, the plated portion may be heated. The heating temperature at that time may be about between 1/3.5 and 2/3 of a melting point (absolute temperature: K) of the metal used in the plating process, or, not more than 4/5 in the case of heating locally for a short time such as laser annealing, for example. By doing so, it is possible to diffuse components between electrodes and plating metal and to improve degree of adhesion. Further, by performing the heating process, it is possible to eliminate strain of the connection in the plated portion and it is also possible to absorb stress of the connection and prevent deterioration.

Figure 5A:
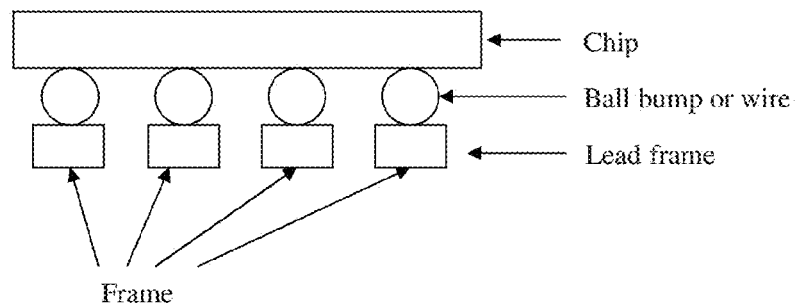
FIG. 5A is a diagram showing an example of a connection by die bonding in the first embodiment of the present invention, in particular showing a case where a substrate is in the form of a lead frame.
Figure 5B:
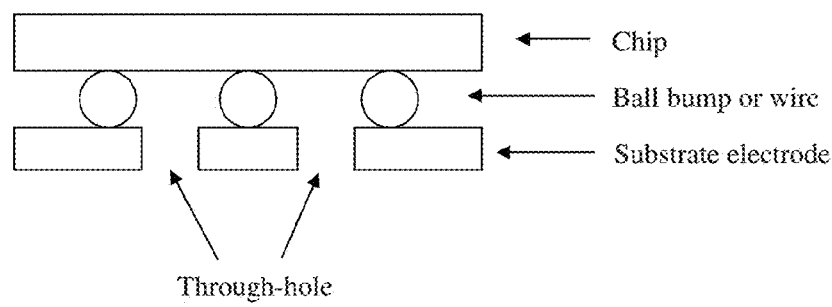
FIG. 5B is a diagram showing another example of the connection by die bonding in the first embodiment of the present invention, in particular showing a case where through-holes are provided in a substrate.
Figure 5C:
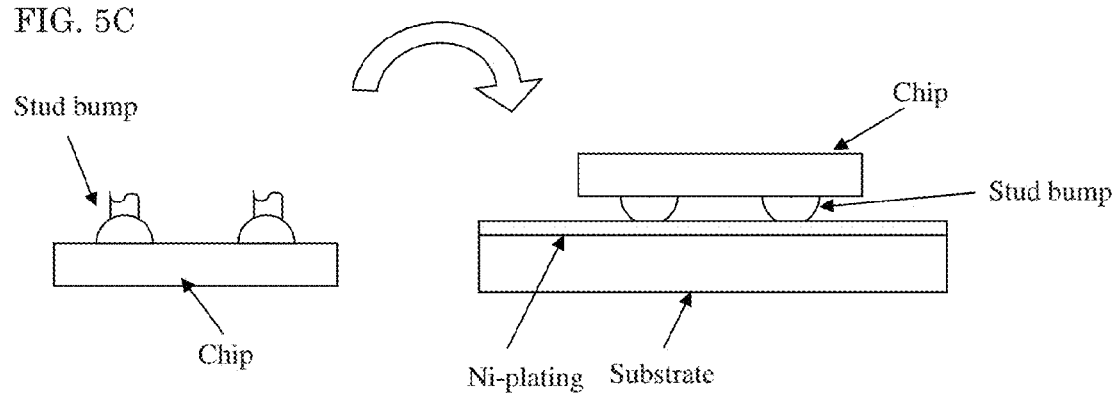
FIG. 5C is a diagram showing a further example of the connection by die bonding in the first embodiment of the present invention, in particular showing a case where stud bumps are used.

Further, in the case where the connecting process is performed by die bonding as in the case of FIG. 3, there are circumstances when the plating solution does not circulate throughout the whole by the only flow of the plating solution from the side. Thus, ways to circulate the plating solution in the substrate electrode may be devised as shown in FIG. 5A to FIG. 5C. FIG. 5A to FIG. 5C are diagrams showing examples of a connection by die bonding. In particular, FIG. 5A shows a case where the substrate is in the form of a lead frame, FIG. 5B shows a case where through-holes are provided in the substrate, and FIG. 5C shows a case where stud bumps are used. In FIG. 5A, ball bumps or wires are deposited on each frame of the lead frame and brought into point-like or linear contact with the chip electrode to make connections. At this time, when the plating solution is circulated from gaps between the frames, the plating solution circulates throughout the whole and it is possible to form a junction having no defect. Incidentally, at this time, it is possible to effectively circulate the plating solution by setting a frame to frame width of the lead frame to be not less than ½ of the substrate thickness, for example.

Further, in FIG. 5B, the substrate electrode and the chip are brought into contact with each other through ball bumps or wires, the substrate is provided with through-holes, and the plating solution is circulated from the through-holes. By doing so, the plating solution is circulated throughout the whole and it is possible to form a junction having no defect. Incidentally, at this time, it is possible to effectively circulate the plating solution by setting a diameter of the through-hole to be not less than ½ of the substrate thickness and by providing two or more through-holes.

Figure 6A:
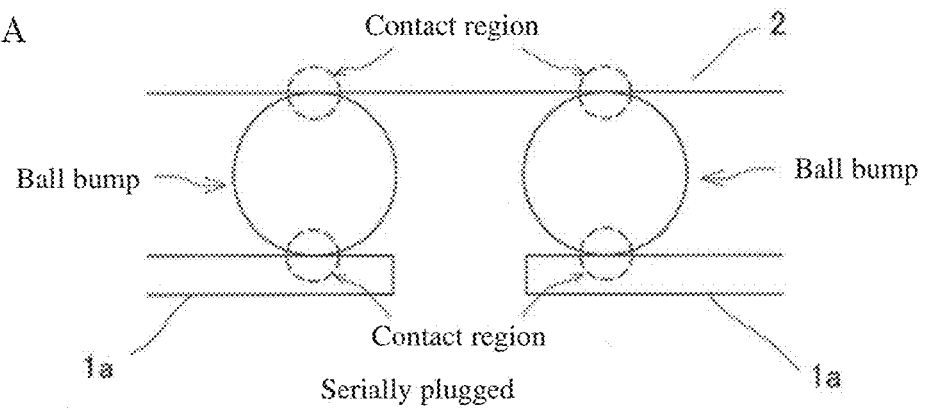
FIG. 6A is a diagram showing one state of a plating process in the case where a substrate has through-holes in the first embodiment of the present invention.
Figure 6B:
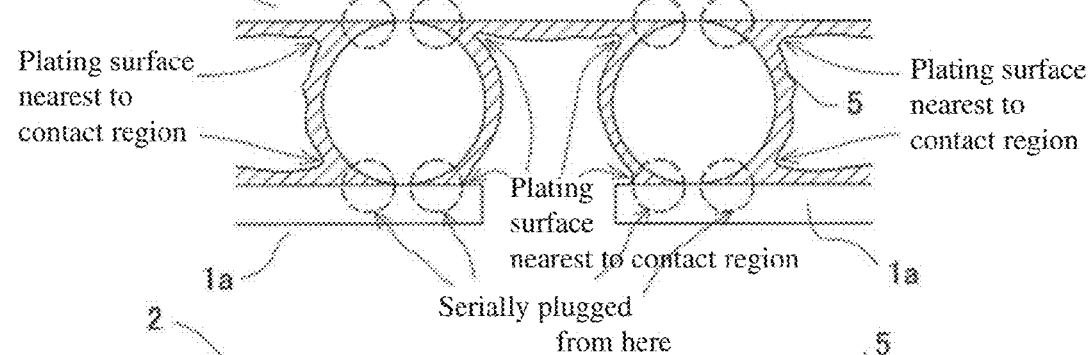
FIG. 6B is a diagram showing one state following FIG. 6A.
Figure 6C:
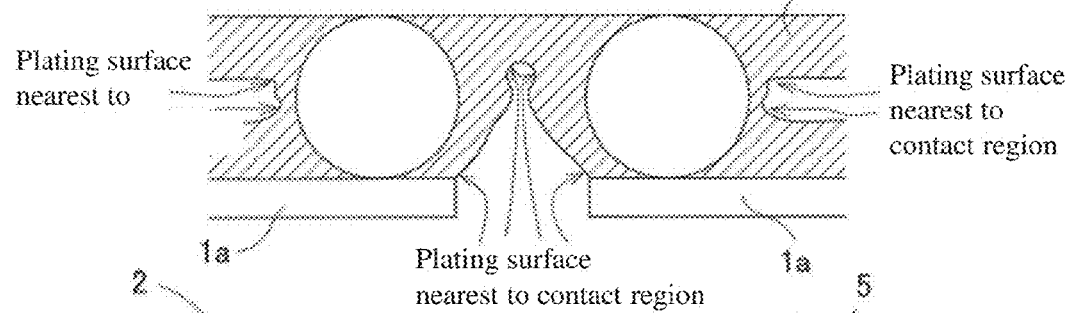
FIG. 6C is a diagram showing one state following FIG. 6B.
Figure 6D:
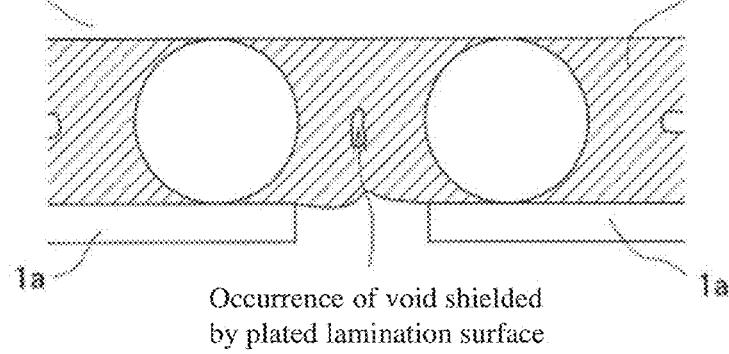
FIG. 6D is a diagram showing one state following FIG. 6C.

The plating process in the case of FIG. 5B will be described in more detail. FIG. 6A to FIG. 6D are diagrams showing a plating process in the case where the substrate has a through-hole(s). FIG. 6A shows a state before starting the plating process. FIG. 6B. FIG. 6C, and FIG. 6D show respective states where the plating process proceeds in the order.

In FIG. 6A, the substrate electrode 1a of the substrate having the through-holes and the backside electrode of the SiC chip 2 are oppositely disposed in indirect contact with each other through a circular arc portion (convex portion) of the ball bump. When under this state the object is immersed in the plating solution to start the plating process, the plating is serially plugged from a contact region surface of the convex portion and opposed surfaces of the electrodes, as shown in FIG. 6B. Then, by maintaining this state, the plating process proceeds as shown in FIG. 6C. At this time, the plating is serially plugged into the Ni plating layer 5 from the region near the contact region surface of the convex portion, and space (or gap) is filled.

In the present embodiment, the plating process is stopped in the state of FIG. 6B or FIG. 6C. That is, it is necessary to stop the plating process, in a state where a plated lamination surface nearest to the contact region surface is in contact with the plating solution, and before a void shielded by the plated lamination surface occurs. If the plating process was continued, portions of the Ni plating layer 5 formed into lamination from opposed surfaces of the respective ball bumps in a region between the ball bumps would be joined together to create a void because the plating process substantially uniformly proceeds as a whole but it is not necessarily uniform, as shown in FIG. 6D. Therefore, in order to form a high-quality Ni plating layer 5, it is very important to stop the plating process in the state as shown in FIG. 6B or FIG. 6C for the same reason as the case of FIG. 4A to FIG. 4D.

With respect to a specific process of stopping the plating process, an immersion time in the plating solution may be adjusted (speed adjustment of a manufacturing line, for example) based on a result of previously conducted preliminary experiments, or the immersion time may be adjusted in real time while measuring a thickness of the plated layer.

Furthermore, in a case where a spacing between the chip and the substrate is sufficient and a facing area is not large, it is not always necessary to provide through-holes, and a wire or ball bump for ensuring enough spacing can be utilized, for example. Further, when creating ball bumps, stud bumps using a wire bonding method may be used as a projection terminal of the plating connection, as shown in FIG. 5C. At this time, the wire can use such metal as gold, silver, and copper.

Furthermore, it is also preferable to join in advance Cu. Ag, or Ni metal balls to one of the electrodes using an ultrasonic wave of 15 kHz or more. Or it is also possible to use those metals having their surface layer coated with low-melting-point metal such as tin or tin alloy and to connect in advance with one or both of the electrodes by heating. These low-melting-point metals can cause the whole to have a high melting point by diffusion with core metal at a high temperature. Preferably the coating has a thickness of not more than ½ (atomic percent) of the total amount of the core metal. Further, the same can be applied to the case of performing a lead or wire connection.

Furthermore, a junction between the electrodes can be formed in advance with low temperature sintered metal. For example, it is possible to connect one electrode with another electrode with a paste containing not less than 5% of metal particle such as Cu, Ag, Ni, or Au having a size of not more than 100 nm, or a paste containing Sn—Cu bilayer particle, and to electroplate a periphery of the junction by high melting point metal. Opposite electrodes having large area are preferably connected in plural in the form of island.

Further, it is also possible to efficiently perform plating process by using the ferromagnetic property of Ni. For example, it is possible to fix objects to be connected by making efforts such as sandwiching the objects with magnetic material in plating process. Moreover, even when the objects to be connected are somewhat distant, it is possible to connect the objects by Ni plating through inducing them utilizing the magnetism of Ni. That is, by providing in advance a shape of a spherical or wire-like projection on one or both of the electrodes, it is possible to more effectively form a state of point-like contact when an attractive force by a magnetic force is produced.

Furthermore, the objects to be connected are not limited to the electrodes of an electrical circuit which are electrically connected as described above, but may be objects to be connected which have been already joined together by low melting point solder, ultrasonic bonding, or welding, or objects to be connected which have not been joined yet other than electrodes. By performing plating process with Ni on joining portions of these objects followed by heating process, it is possible to coat the objects with Ni having a high melting point and good corrosion resistance to improve durability and to allow rigid connection with enhanced adhesion by heat process.

Furthermore, by utilizing the electrode connection method according to the present embodiment, both connection on the upper surface side of the SiC chip 2 and connection on the lower surface side of the SiC chip 2 can be connected by Ni plating as shown in FIG. 1, so that it is possible to form an electrode connection structure having overall heat resistance. Further, since both use the same material and perform similar Ni plating process, it is possible to perform the process simultaneously. Therefore, it is possible to simplify steps of the process and to stabilize quality. For example, specifically, a surface electrode and a backside electrode of a diode can be connected at the same time with corresponding electrodes of a lead frame. Conventionally, each connection was carried out by an individual process, while according to the present invention, each connection can be carried out simultaneously by one process and it is possible to improve efficiency of process.

An electrode connection method and an electrode connection structure according to some other embodiments will be described with reference to FIG. 7A to FIG. 12B.

Second Embodiment

Figure 7A:
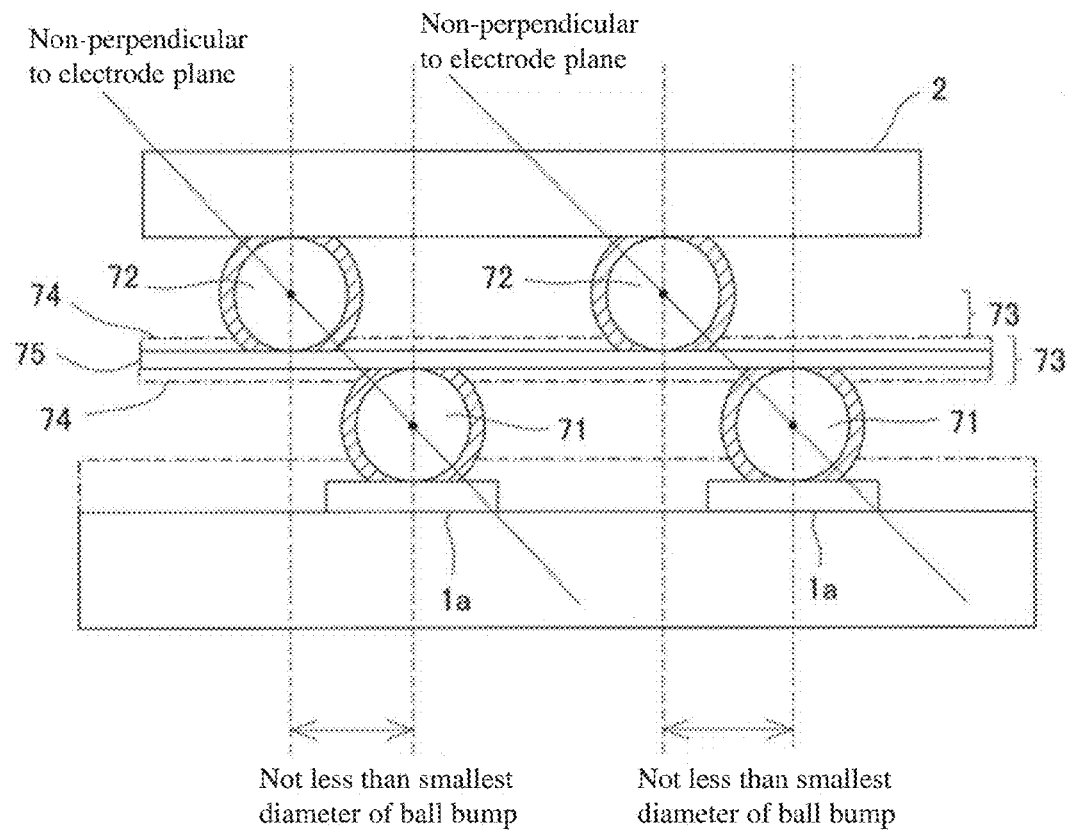
FIG. 7A is a diagram showing an example of a configuration of using an interposer in an electrode connection structure according to a second embodiment of the present invention.
Figure 7B:
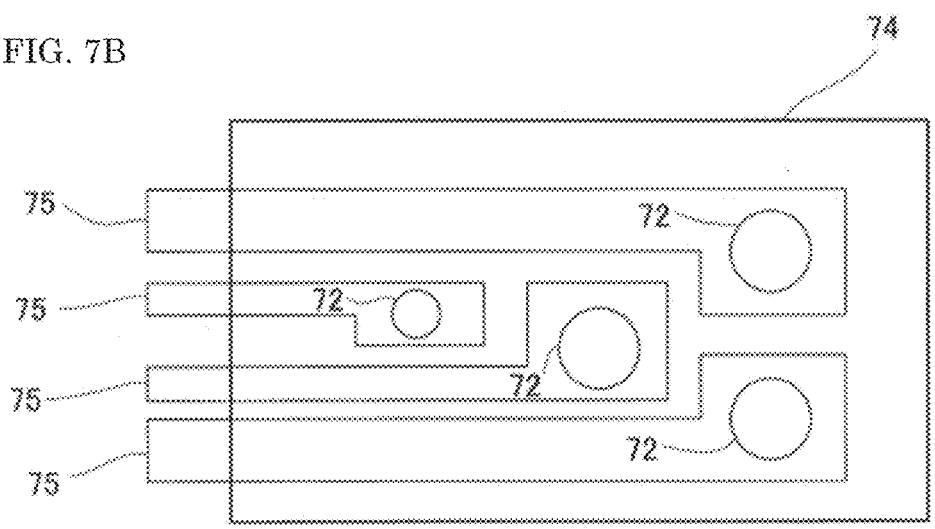
FIG. 7B is a diagram showing an example of patterned interposers in the configuration of FIG. 7A.

FIG. 7A and FIG. 7B are diagrams showing an example of a configuration of using an interposer in an electrode connection structure according to the second embodiment of the present invention. In FIG. 7A, a convex electrode (in this case, a ball bump 71) is in direct contact and connected with the substrate electrode 1a, and another convex electrode (in this case, a ball bump 72) is also in direct contact and connected with the backside electrode of the SiC chip 2. The respective ball bumps 71 and 72 are electrically connected through an interposer 73. At this time, the substrate electrode 1a and the backside electrode of the SiC chip 2 are oppositely disposed substantially parallel to each other. Plating process through the interposer 73 is carried out in a state where a straight line connecting the respective centers of the corresponding ball bumps 71 and 72 is not perpendicular to the surface of the substrate electrodes 1a and the surface of the backside electrode of the SiC chip 2.

The interposer 73 is in the form of a flat plate of a unity of an insulating substrate 74 such as a polyimide resin substrate and a conductive foil 75 such as a copper foil. The interposer 73 can also use such a flat plate that a wiring pattern can be formed on the copper foil. In other words, it enables an electrical exchange through the interposer 73. A copper ball bump is suitable for the ball bumps 71 and 72, for example. A diameter of the ball bumps 71 and 72 can be between 30 μm and 760 μm.

In addition, respective positions of the corresponding ball bumps 71 and 72 between which the interposer 73 is placed, are displaced by not less than the smallest diameter of the ball bumps 71 and 72. By doing so, it is possible to relax, by the interposer 73, stress between the ball bumps 71 and 72 which are firmly joined together by plating process through the interposer 73, and to make it function effectively. If a thickness of the conductive foil 75 is not less than 10 μm it can be used as a conductive interposer. Further, the conductive foil 75 can be patterned in accordance with a circuit of connection between electrodes as shown in FIG. 7B. Further, it is possible to increase heat dissipation by increasing wiring width and thickness. That is, the interposer 73 can be used for any of stress relaxation, heat dissipation, and electrode lead, or for multiple purposes thereof. Incidentally, through-holes may be provided in the interposer 73 for the circulation of the plating solution as shown in FIG. 5B.

Third Embodiment

Figure 8:
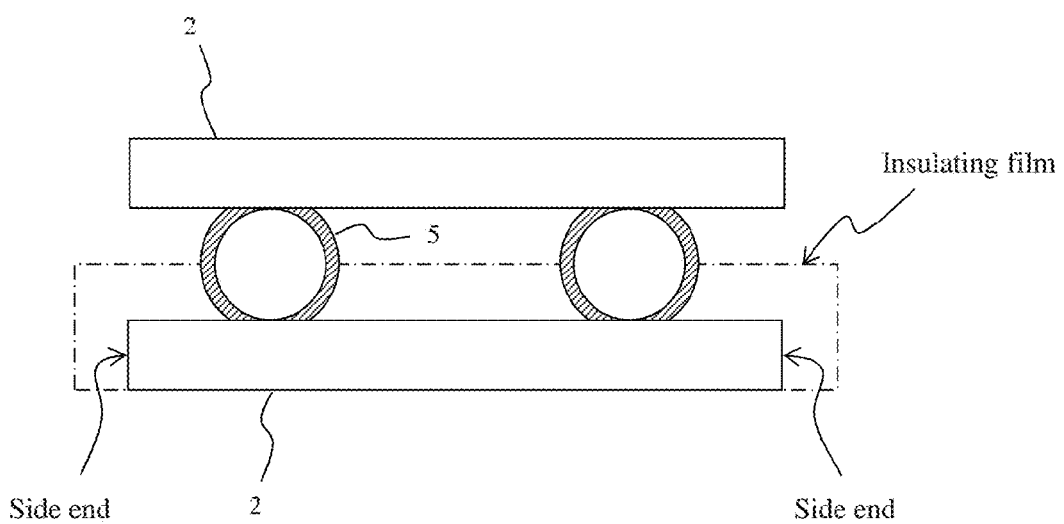
FIG. 8 is a diagram showing an example of a configuration of coating side surfaces of a chip in an electrode connection structure according to a third embodiment of the present invention.

FIG. 8 is a diagram showing an example of a configuration of coating side surfaces of a chip in an electrode connection structure according to the third embodiment of the present invention. When the chip is immersed in a plating solution, the surface of the chip is covered with a film such as an insulating material, but side ends may be bared, as shown in FIG. 8. In such a case, there is a possibility that the side ends are contaminated by the plating solution, so that the side ends of the chip are coated with an insulating material as shown in FIG. 8. By doing so, it is possible to prevent contamination of the chip by the plating solution. Incidentally, the coating with the insulating material may be applied only to the side ends of the chip, or it may be also applicable to cover the whole with photosensitive resin, expose and develop the resin using a mask, and expose only portion to be plated. In the case of resin whose heat resistance is not sufficient, the resin may be removed as with a solvent after the completion of plating. Moreover, it is also possible to coat the side ends of the chip by using resin having a high heat resistance such as polyimide resin, and to conduct packaging as it is without removing the resin.

Fourth Embodiment

Figure 9A:
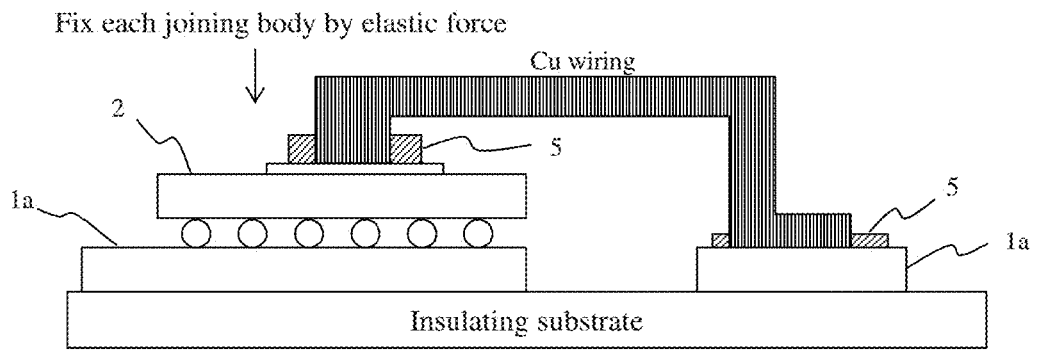
FIG. 9A is a diagram showing an example of a configuration of fixing an arrangement during a plating process in an electrode connection structure according to a fourth embodiment of the present invention.
Figure 9B:
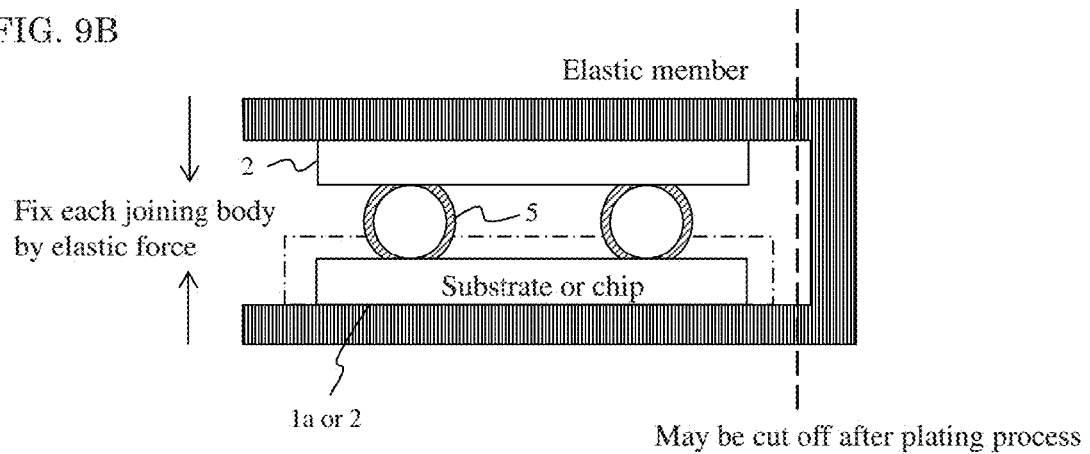
FIG. 9B is a diagram showing another example of the configuration of fixing the arrangement during the plating process in the electrode connection structure according to the fourth embodiment of the present invention.
Figure 9C:
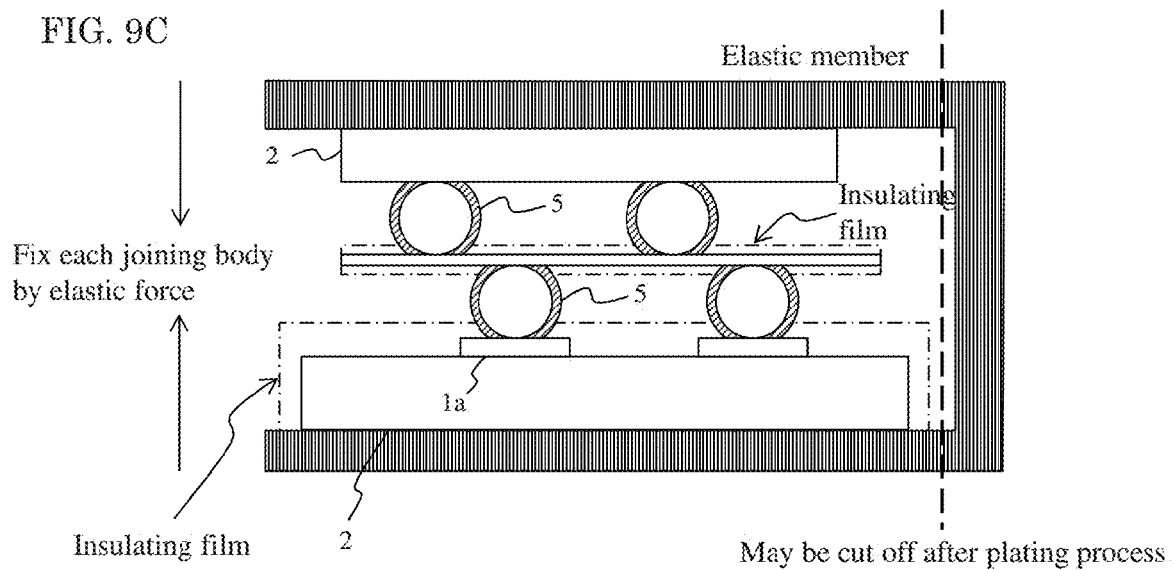
FIG. 9C is a diagram showing a further example of the configuration of fixing the arrangement during the plating process in the electrode connection structure according to the fourth embodiment of the present invention.

FIG. 9A to FIG. 9C are diagrams showing examples of a configuration of fixing an arrangement during a plating process in an electrode connection structure according to the fourth embodiment of the present invention. As described above, the objects to be joined such as the electrodes, the convex electrode (such as a ball bump) interposed between the electrodes, and the interposer, are immersed in the plating solution during plating process. At this time, the objects should be held in a state where they are positioned. As for the way of holding an arrangement, it is possible to use a method of fixing the arrangement by utilizing an elastic force. This elastic force is obtained by vertically sandwiching in chip-chip or chip-substrate between member having the elastic force.

In a case where conductivity and heat dissipation are required, it is possible to fix an arrangement by a vertical elastic force using a wiring of such as Cu alloy or Fe—Ni alloy, and cause the wiring to function as a part of components of a package, as shown in FIG. 9A. Further, it is possible to reduce process cost by fixing each object to be joined at an individual position in an inner region of an elastic member (such as a metal tape) formed into a U-shape, conducting plating process on the whole at a time, and then cutting off a side portion of the U-shaped elastic member for separation.

Fifth Embodiment

Figure 10A:
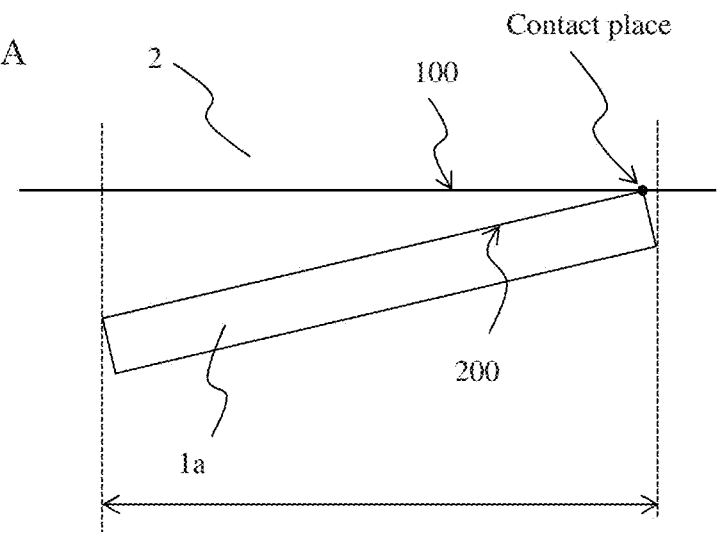
FIG. 10A is a diagram showing an example of an arrangement structure of electrodes in the electrode connection structure according to a fifth embodiment of the present invention.
Figure 10B:
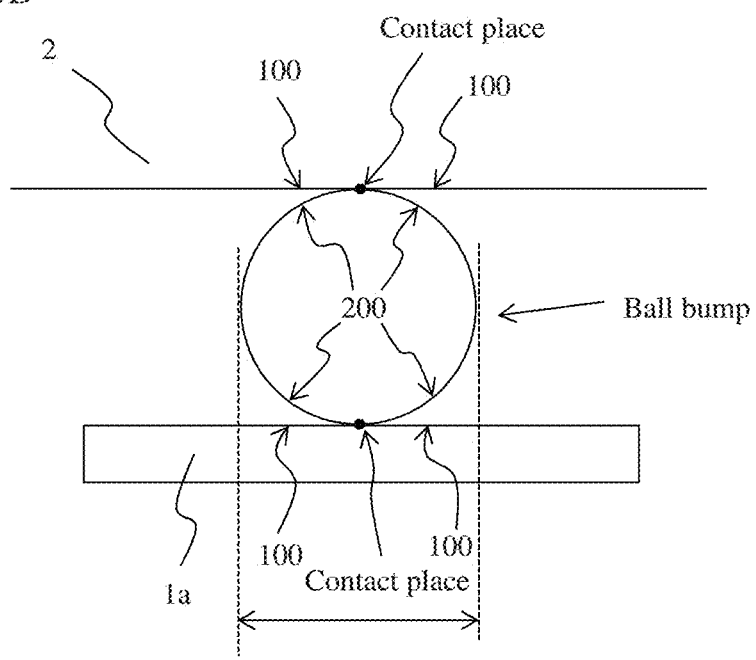
FIG. 10B is a diagram showing another example of the arrangement structure of electrodes in the electrode connection structure according to the fifth embodiment of the present invention.

Other electrode connection structure according to the present invention will be described with reference to FIG. 10A to FIG. 12B. FIG. 10A and FIG. 10B are diagrams showing examples of an arrangement structure of electrodes in the electrode connection structure according to the fifth embodiment of the present invention. FIG. 10A shows a structure when the backside electrode of the SiC chip 2, which corresponds to a first electrode, and the substrate electrode 1a, which corresponds to a second electrode, are connected by plating. FIG. 10B shows a structure when the backside electrode of the SiC chip 2, which corresponds to a first electrode, and the substrate electrode 1a, which corresponds to a second electrode, are connected by plating through the ball bump(s).

In FIG. 10A, the backside electrode of the SiC chip 2 and the substrate electrode 1a are in partly linear or point-like direct contact with each other. A nearby region of a contact place with the substrate electrode 1a in the backside electrode of the SiC chip 2 is referred to as a first contact part 100, and a nearby region of a contact place with the backside electrode of the SiC chip 2 in the substrate electrode 1a is referred to as a second contact part 200. Further, in FIG. 10B, the backside electrode of the SiC chip 2 and the substrate electrode 1a are indirect contact with each other through the ball bump. Nearby regions of contact places with the ball bump in the backside electrode of the SiC chip 2 and the substrate electrode 1a are referred to as a first contact part 100, and nearby regions of contact places with the backside electrode of the SiC chip 2 and the substrate electrode 1a in the ball bump are referred to as a second contact part 200.° C.

Note that the nearby region of the contact place may be defined as a (overlapping) region onto which the substrate electrode 1a is projected or a region within the projected region, when viewed from a direction perpendicular to a backside electrode surface of the SIC chip 2, in the case as shown in FIG. 10A, for example. Further, the nearby region of the contact place may be defined as a (overlapping) region onto which the ball bump is projected or a region within the projected region, when viewed from the direction perpendicular to the backside electrode surface of the SiC chip 2, in the case as shown in FIG. 10B, for example.

Figure 11A:
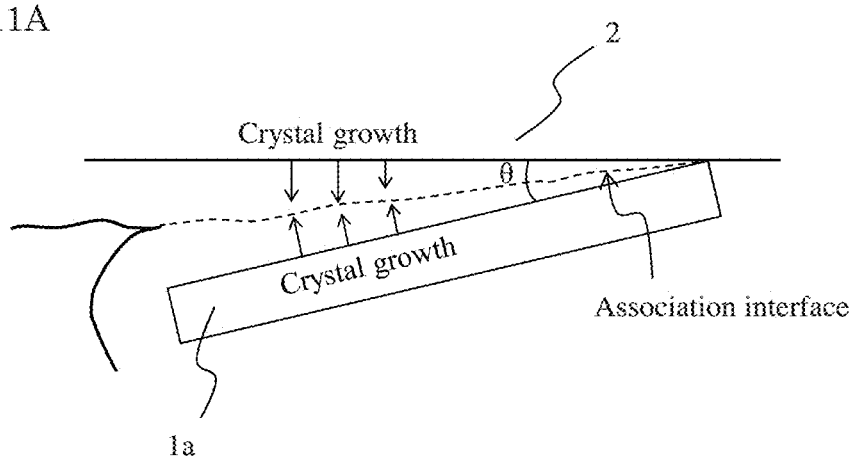
FIG. 11A is a diagram showing a structure in which the electrodes of FIG. 10A were connected by plating.
Figure 11B:
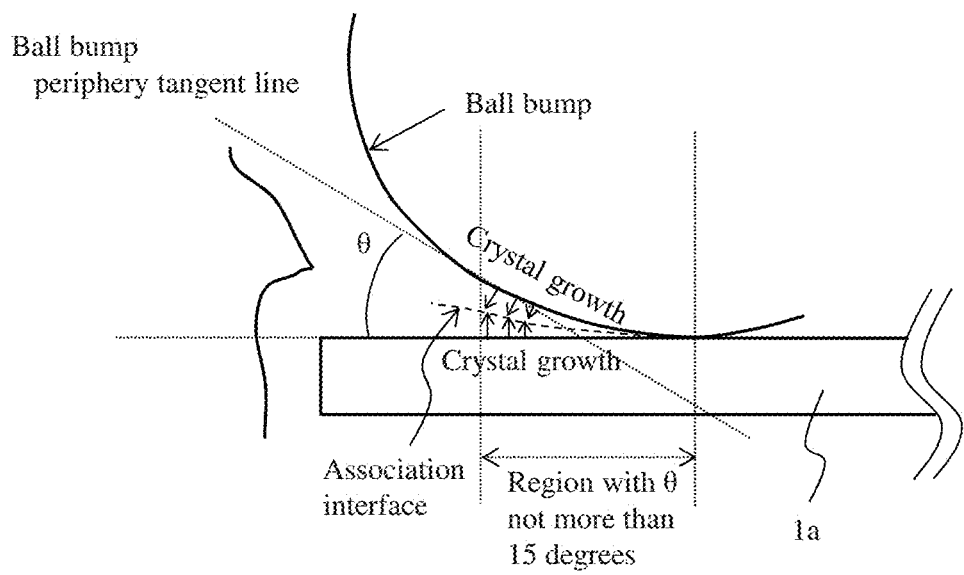
FIG. 11B is a diagram showing a partial structure in which the electrodes of FIG. 10B were connected by plating.
Figure 12A:
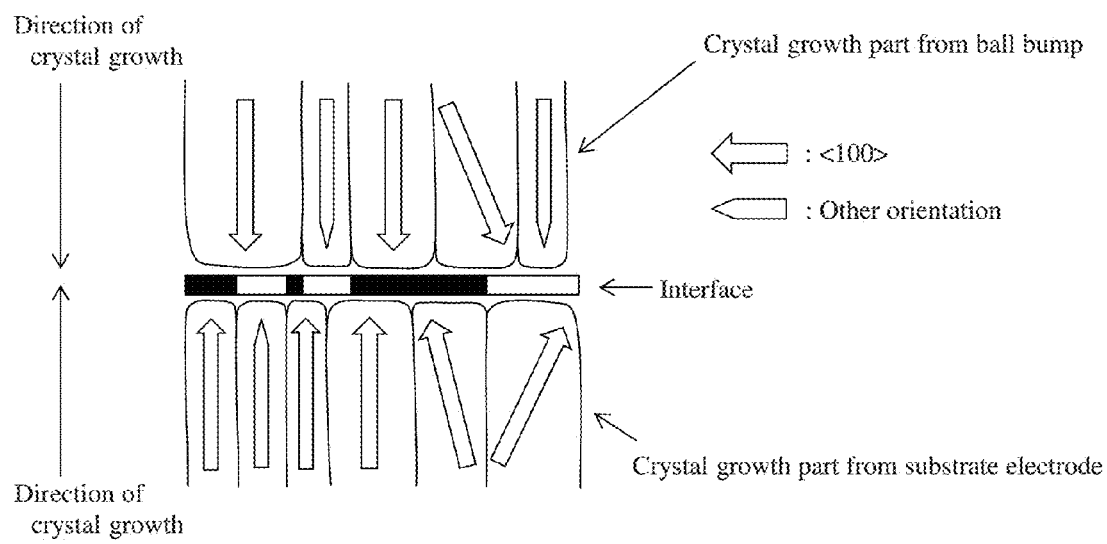
FIG. 12A is a schematic diagram showing a structure in an association interface of the plating in FIG. 11A or FIG. 11B.
Figure 12B:
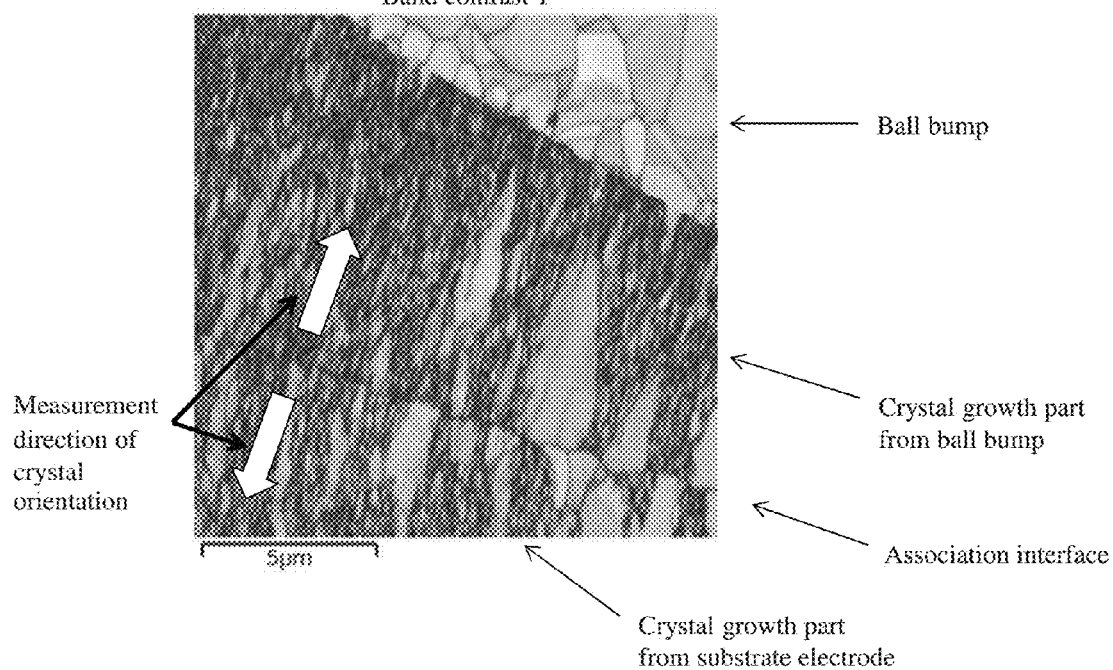
FIG. 12B shows an example of an electron micrograph of the association interface of the plating in FIG. 12A.

FIG. 11A and FIG. 11B are diagrams showing a structure in which the electrodes of FIG. 10A and FIG. 10B were connected by plating, respectively. FIG. 12A and FIG. 12B are enlarged views of the connection structure in FIG. 11B. FIG. 11A shows a structure in which the electrodes of FIG. 10A were connected by plating, and FIG. 11B shows a partial structure in which the electrodes of FIG. 10B were connected by plating (an enlarged view near the contact place). FIG. 12A is a schematic diagram showing a structure in an association interface of the plating, and FIG. 12B shows an example of an electron micrograph of the association interface of the plating. When the opposing electrode(s) and/or conductive terminal are connected by plating in the first contact part 100 and the second contact part 200 of FIG. 10A or FIG. 10B, it is preferable that plating grows in a direction perpendicular to each of the opposing surfaces, as shown in FIG. 11A and FIG. 11B. Furthermore, by resulting in its organization's being columnar, i.e., columnar crystal, it is possible to inhibit the formation of a defect such as a void at an interface where association between columnar crystals which have grown from respective opposing surfaces occurs.

Further, from this fact, it is preferable that the interface where association between grown columnar crystals occurs has an orientation difference of each crystal relative to the vertical direction of the interface within 15 degrees as shown in FIG. 11 and FIG. 12, more preferably within 10 degrees. In other words, it is preferable that the formed crystal interface has a higher percentage of twist grain boundaries than tilt grain boundaries. Since twist grain boundary has a lower interface energy compared to tilt grain boundary, segregation of defects and impurities is reduced.

As for a method of growing columnar crystal plating and increasing a percentage of twist grain boundaries in the interface, it is possible to control it by setting a plating current density to be not more than 10 A/dm$^2$, for example, and by preparing additive agents to a plating solution, in the case of Ni plating. Incidentally, in order to form the columnar crystal organization plating and increase the percentage of twist grain boundaries, it is effective to preferentially grow in a <100> or <110> direction of crystal orientations from the first contact part 100 and the second contact part 200.

Further, in order to control the orientation difference at the crystal interface to be within 15 degrees, it is desirable to set the angle θ between the first contact part 100 and the second contact part 200 to be within 15 degrees. That is, the crystal which has grown from the region with the angle θ between the first contact part 100 and the second contact part 200 within 15 degrees is likely to have an orientation difference within 15 degrees at the interface where that crystal associates. It is desirable that crystal association occurs with the orientation difference within 15 degrees at least at a percentage of not less than 50% of the entire interface where crystal which has grown from the region with the angle θ within 15 degrees associates.

That is, it is desirable that such a region that at the interface where crystal which has grown from the first contact part 100 and crystal which has grown from the second contact part 200 associate, crystal orientation is uniform (<100> or <110>) and its orientation difference is within 15 degrees, becomes not less than 50% of entire interface, as shown in FIG. 12A.

This is also important from the need to increase the strength of the association interface by reducing the crystal orientation difference in a range (region) where the angle θ between the first contact part 100 and the second contact part 200 is within 15 degrees because such a region in particular is subject to stress concentration against external force.

Incidentally, in order to measure a crystal orientation difference, it is possible to polish a cross section of a junction, to measure crystal orientations of both sides of each association interface by an electron backscatter diffraction (EBSD) method, and to measure crystal orientation differences of both sides in a direction perpendicular to the interface.

Thus, in the electrode connection structure according to the present embodiment, it is possible to inhibit the formation of a defect such as a void, by setting, at an association interface between crystal which has grown from the first contact part and crystal which has grown from the second contact part, a crystal orientation difference to be within 15 degrees relative to the association interface. Further, it is possible to reduce segregation of defects and impurities, by setting, at an association interface of the crystal which has grown from a region with an angle between the first contact part and the second contact part within 15 degrees, a percentage of a region with crystal orientation difference within 15 degrees relative to the interface not less than 50% of the whole.

Examples

Figure 13A:
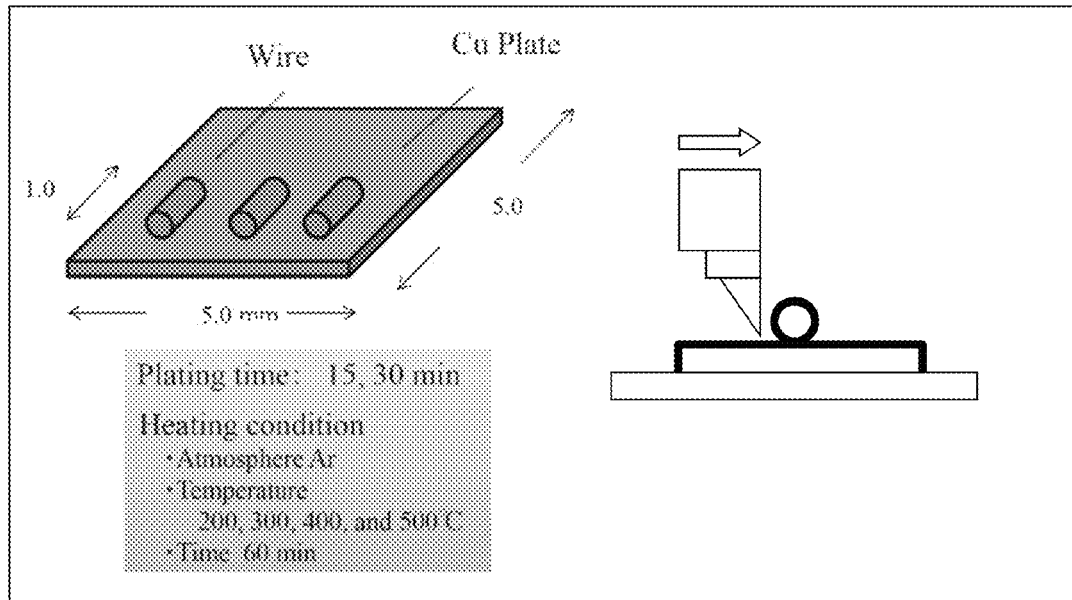
FIG. 13A is a schematic diagram showing an experimental system for an share test on an electrode connection structure according to the present invention.
Figure 13B:
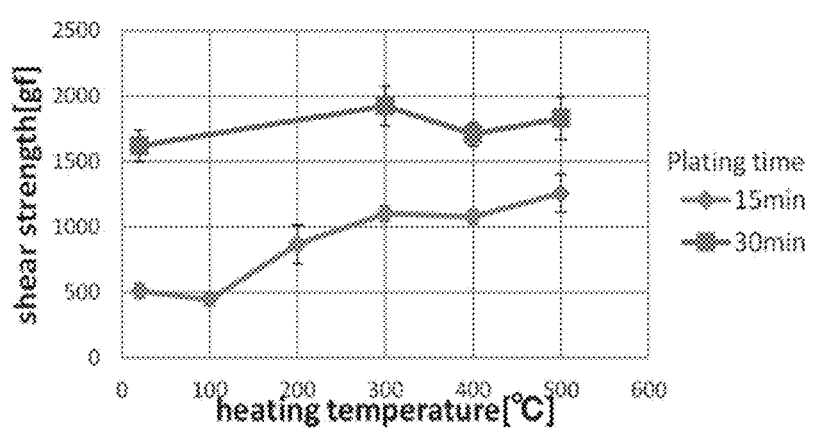
FIG. 13B shows an example of a result of the share test conducted under the experimental system of FIG. 13A.

Some experiments on the electrode connection structure and electrode connection method according to the present invention were conducted.
(1) Share Test To verify if samples subjected to plating junction have a high heat resistance, shear strength changes after heating were measured. Samples to be measured were prepared by bringing Cu wires (1 mmL, φ; 172 μm) into contact with a Cu plate and performing plating for 15 minutes or 30 minutes in a state where a plating solution was sufficiently circulated around contact portions. The resultant was then heated in an argon (Ar) atmosphere and a share test was finally performed. The share test was performed 9 times at each temperature and average values of the share rupture strength were determined. FIG. 13A and FIG. 13B show an experimental system and a result of the share test. Specifically, FIG. 10A is a schematic diagram of the experimental system, and FIG. 10B shows an example of the result. In the share test, a force when peeling off the Cu wire from the Cu plate was measured as shown in FIG. 10A.

Figure 14A:
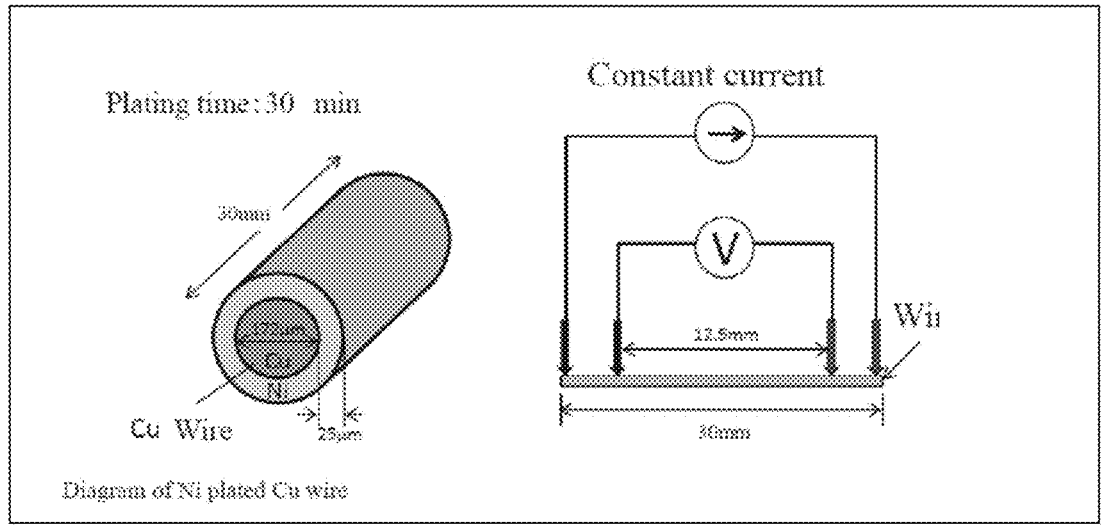
FIG. 14A is a schematic diagram showing an experimental system for measuring resistance values of an electrode connection structure according to the present invention.

As seen from the result shown in FIG. 10B, sufficient shear strength was obtained for both plating times of 15 minutes and 30 minutes even after the heating at a temperature of 500° C. Further, in both cases, the shear strength increased as the heating temperature was raised. This is because alloying of Cu—Ni proceeded by diffusion and adhesion and strength of the interface increased. Further, no second phase was formed at the interface. Therefore, the result revealed that no deterioration of the Cu—Ni plating junction in a high temperature environment occurs.
(2) Resistance Value Measurement for Cu—Ni Alloy Since a resistance value may increase when a Cu—Ni alloy layer is formed in a high temperature environment, resistance value changes by alloying were measured. Samples to be measured were prepared by plating Cu wires (30 mm, φ; 172 μm) for 30 minutes as shown in FIG. 14A. The resultant was then heated in an argon (Ar) atmosphere and resistance value measurement was performed by the four-terminal method. Here, the wire diameter after plating was 222 μm and the length between the voltage measuring terminals of the wire to be measured was 12.5 mm. A result of the measurement is shown in FIG. 14B.

Figure 14B:
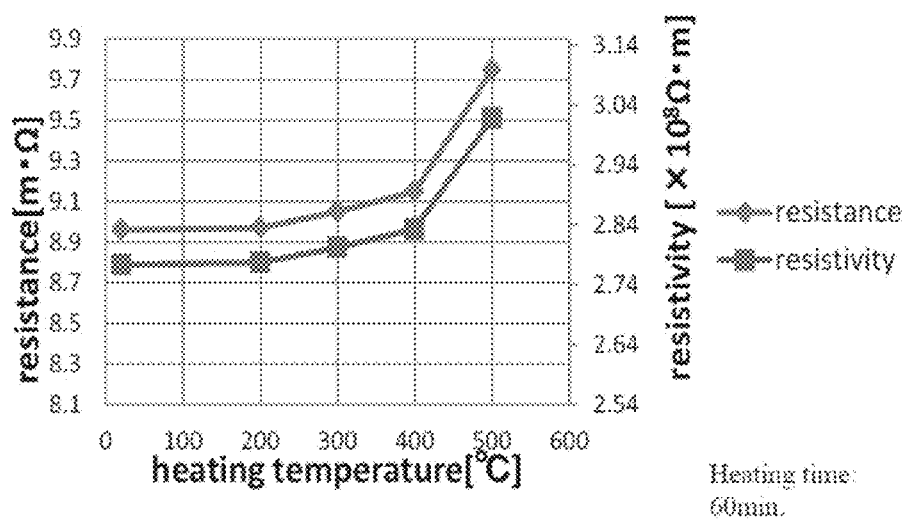
FIG. 14B shows an example of a result of the resistance value measurement conducted under the experimental system of FIG. 14A.
Figure 15A:
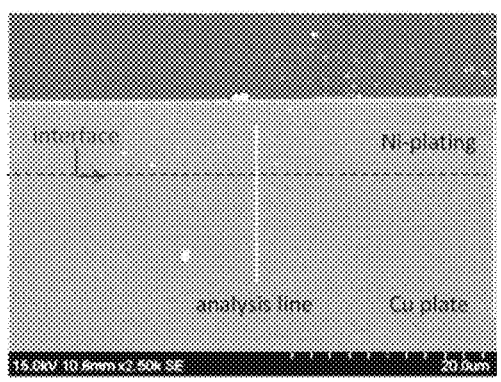
FIG. 15A shows an example of a result of a diffusion analysis under a condition of non-heating on an electrode connection structure according to the present invention.
Figure 15A:
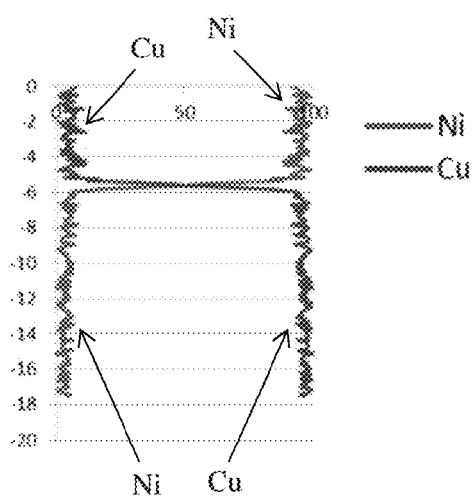
Figure 15B:
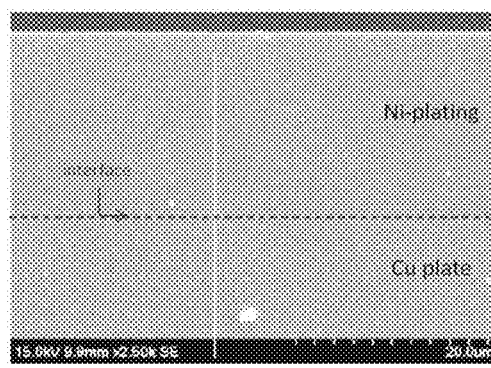
FIG. 15B shows an example of a result of a diffusion analysis under a condition of heating at 300° C. on the electrode connection structure according to the present invention.
Figure 15B:
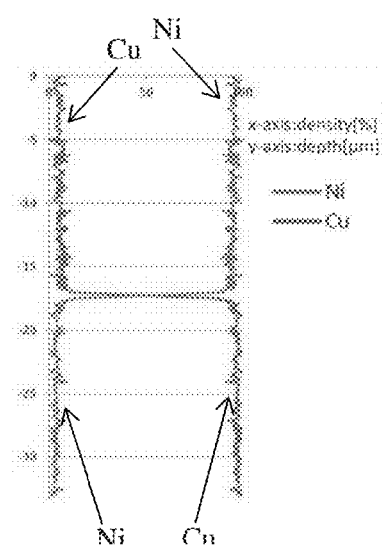
Figure 15C:
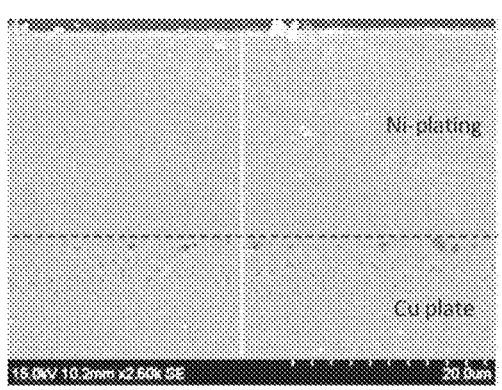
FIG. 15C shows an example of a result of a diffusion analysis under a condition of heating at 500° C. on the electrode connection structure according to the present invention.
Figure 15C:
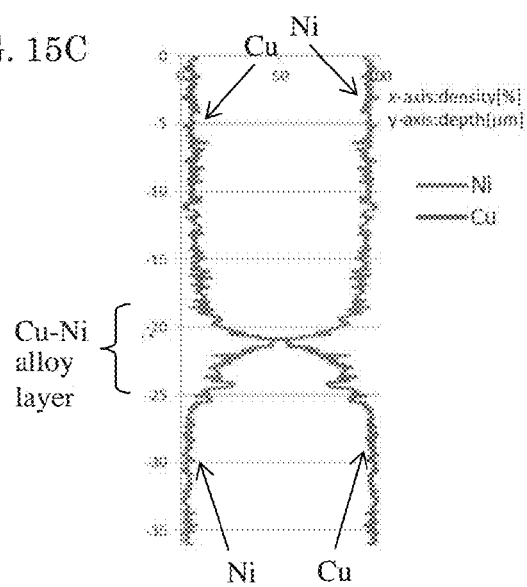

Diffusion proceeded with increased temperature and resistance values were also increased correspondingly, as shown in FIG. 14B. However, the increase in resistance value even after the heating at 500° C. (60 minutes) was considerably as small as about 10%. This fact revealed that defects in question can be considered not to have occurred.
(3) Analysis of Cu—Ni Diffusion State To confirm the state of diffusion of Cu—Ni, a Cu plate was subjected to Ni plating and the appearance of the cross section of the sample after heating was observed by scanning electron microscope (SEM) (2.5 k times power) (S-3400N by Hitachi). Further, element distribution of an interface was measured by energy dispersive X-ray analysis (EDX) line analysis. The result is shown in FIG. 15A to FIG. 15C. FIG. 15A to FIG. 15C show positions of density distributions in the SEM images correspondingly with graphs, respectively. Specifically, FIG. 15A shows a result in the case of non-heating, FIG. 15B shows a result in the case of heating for 60 minutes at 300° C., and FIG. 15C shows a result in the case of heating for 60 minutes at 500° C.

°When comparing the case of non-heating in FIG. 15A with the case of heating at 300° C. in FIG. 15B, both cases showed that concentration of Cu and Ni was completely reversed at the boundary of the interface and little change in the concentration distribution was seen. However, in the case of heating at 500° C. in FIG. 15C, from the concentration distribution, it was confirmed that a Cu—Ni alloy layer of about 5 μm was formed.
(4) High-Temperature Circuit Operation Test and Evaluation Using SiC Diode Chip To evaluate whether the junction technology as described above is practical as an interconnection technology of power devices, a circuit operation test in a high temperature environment using a SiC-SBD chip (1200 V, 15 A by SiCED) was conducted. The chip had an Al electrode and an Ag electrode formed on the anode surface and the cathode surface, respectively, and had a thickness of 365 μm and a size of 2.7 mm×2.7 mm.

Figure 16A:
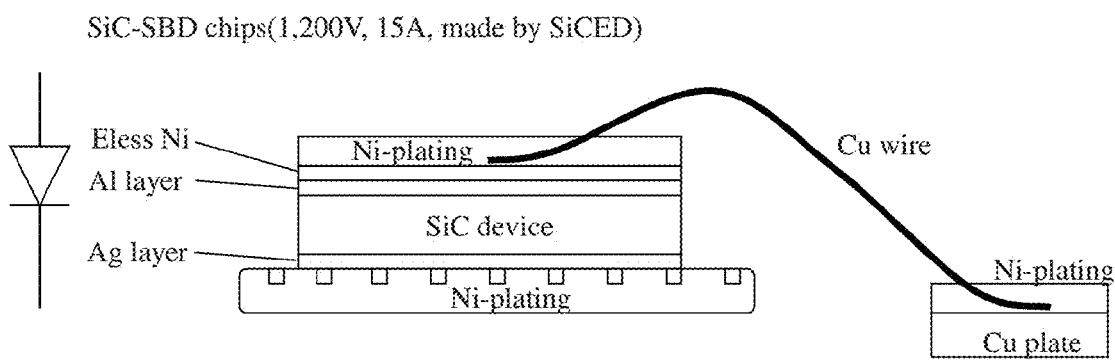
FIG. 16A is a diagram showing an example of a sample for a high-temperature circuit operation test using an electrode connection structure according to the present invention.

Samples were prepared by using Ni micro plating for joining a chip electrode and a substrate lead electrode, by joining the Al electrode and a Cu plate (plating time of 30 minute) so as to connect with each other by a Cu wire, and by joining the Ag electrode side and a lead frame using the Ni micro plating for die bonding, as shown in FIG. 16A.

Incidentally, the surface of the Al electrode side became a Ni layer by electroless Ni plating treatment in advance. That is, when the surface is formed of an aluminum alloy as described above, it is preferable to form a nickel film in advance by electroless plating in order to enable deposition of connection electroplating. A thickness of the electroless plating at that time is preferably between 0.1 and 10 μm. If the thickness is less than 0.1 μm, bad connection is more likely to occur in a case where there are defects such as a surface defect. If the thickness is greater than 10 μm, the electroless plating takes time and it is practically disadvantageous. Further, it is preferable to form a film of metal such as Ti, TiW, Ni, and NiV or its alloy by such a method as physical vapor deposition. It is preferable to form a film composed mostly of copper, palladium, nickel, gold, rhodium, or silver on the uppermost layer. A thickness of any film is preferably between 0.05 and 3 μm. In this case, it is possible to form a uniform film as compared with the case of electroless plating. However, the formation of a film having a thickness greater than 3 μm becomes high in cost, which is disadvantageous for practical use.

Figure 16B:
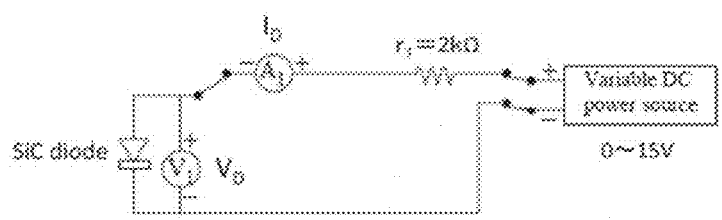
FIG. 16B is a diagram showing an example of a circuit for the high-temperature circuit operation test on the sample of FIG. 16A.
Figure 16C:
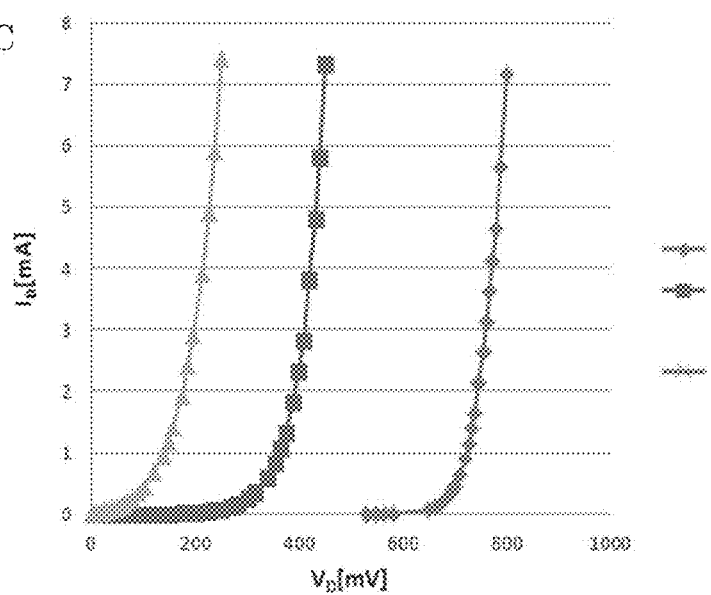
FIG. 16C is a diagram showing an example of a result of the high-temperature circuit operation test conducted under the sample of FIG. 16A and the circuit of FIG. 16B.

Then, an electric current was passed from the Ag plate to the Cu plate while heating the joined sample on a hot plate at fixed temperature of each heating temperature (20 to 300° C.). Then, a voltage (VD) and a current (ID) of the diode were measured while changing a power supply voltage (0 to 15 V) as in the circuit diagram of FIG. 16B. The result at that time is shown in FIG. 16C. From this result, a diode V-I characteristic was confirmed at a high temperature environment of 300° C. and degradation of the junction was not confirmed. Therefore, the result revealed that there was no deterioration of the junction by heating and high temperature operation at about 300° C. is possible.

(5) Measurement of Vickers Hardness

To examine what changes in hardness of Ni thin film surface deposited by plating will come out with heat, Vickers hardness measurement test was performed. The measurement was performed using a micro Vickers hardness tester (MHT-1 by Matsuzawa Seiki) for. Vickers hardness is one of a measure indicating hardness and is represented by HV. A square pyramid indenter was pushed in the surface of the sample and, from an area of the remaining indentation after releasing the load, the hardness is determined by a conversion table. The indentation is small if the sample is hard but large if soft.

To prepare the sample to be used, at first, plating was performed on a copper plate (5×5 mm) with a plating time of 15 minutes at a current density of 5 A/dm. Then, the resultant was heated in an argon atmosphere using a high-temperature tube furnace. The heating temperature was set to 100, 200, 300, 400, and 500° C. and the heating time was one hour. Further, a load of the indenter at the time of Vickers hardness measurement was 100 g and the time for applying the load was set to 15 seconds. In the measurement, an unheated ((20° C.) sample was prepared for comparison, data was taken at five points at each temperature, and then an average value of the data at five points was calculated.

Figure 17:
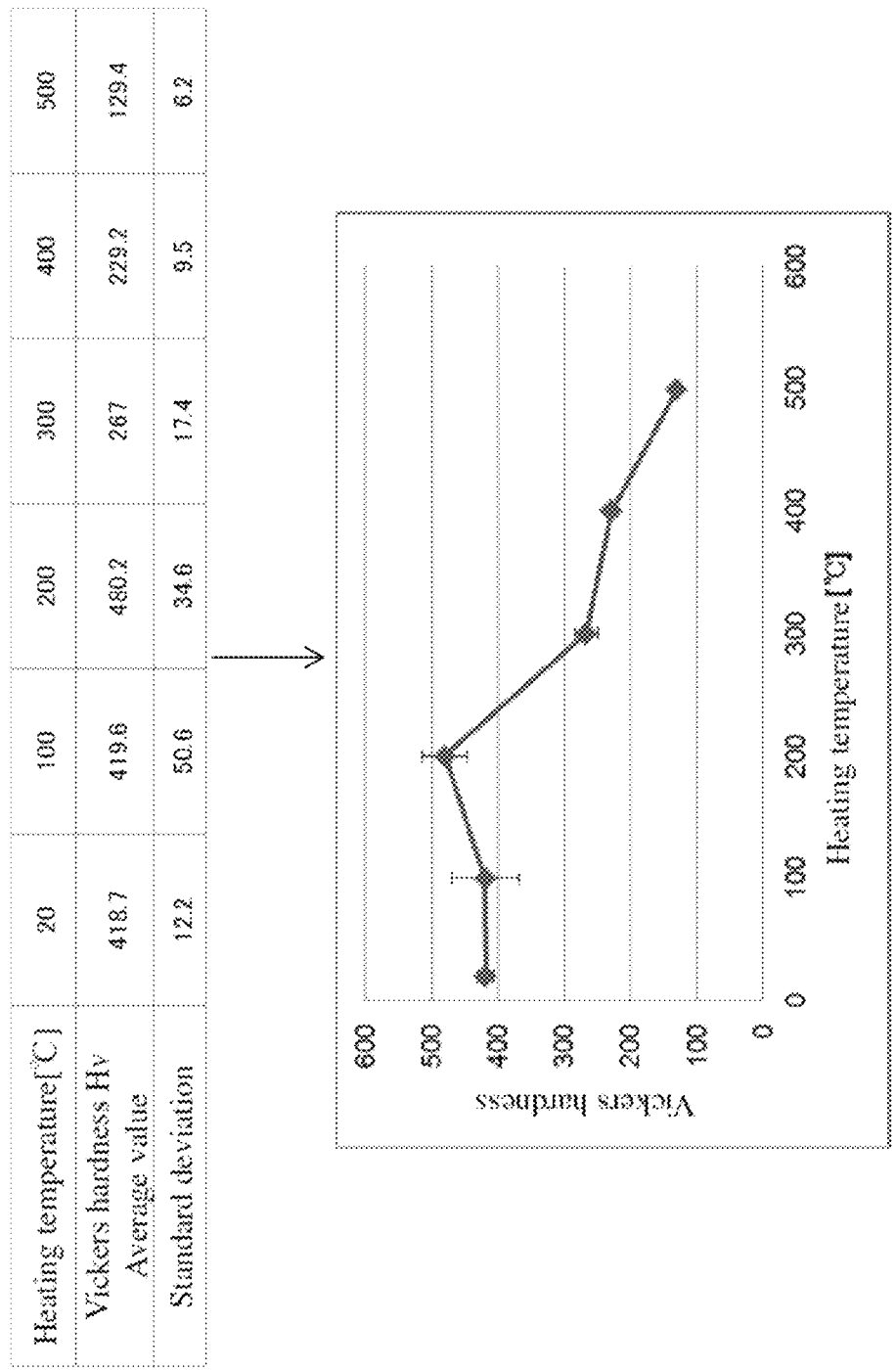
FIG. 17 shows an example of a result of a Vickers hardness measuring test on an electrode connection structure according to the present invention.

A result of the measurement is shown in FIG. 17. From the result, although there is a margin of error, it is understood that the hardness is lowered with increased heating temperature. This is because it is considered that the Ni thin film was annealed by heating. Originally, there are a lot of lattice defects within metal. By heating, atoms move and the rearrangement occurs, so that defects are reduced. Then, since dislocation is easily moved, there becomes no strain and internal stress of the metal is relaxed. The relaxation of internal stress leads to improve the reliability of the junction.

Incidentally, the heating temperature when performing the annealing is preferably about not less than 1/3.5 of the melting point (K) of the metal used in the plating process as described above. The heating time at that time is preferably between several seconds in the case of laser annealing and several tens of minutes in the case of normal heating, for example.

The above-mentioned experimental result demonstrated that the Ni micro plating joining can be applied to the joining between the chip of the power device and the substrate electrode as well as the die-bonding joining to the substrate of the chip. Further, it demonstrated that it is possible to ensure joining reliability at a high temperature of not less than 300° C. even by the joining at a low temperature. Further, no degradation of the Cu—Ni plating junction was observed in a diffusion test at 500° C.

Further, Ni plating joining was simultaneously performed for both the joining between the chip and the substrate electrode and the joining by die bonding using the SiC diode chip, and the normal operation at a high temperature environment of about 300° C. was confirmed. From the above, the chip joining technology by micro plating has a high heat resistance, and has a high possibility of being put into practical use as a convenient and low-cost mounting technology which can ensure high reliability.

(6) Measurement of Crystal Orientation Difference in Plating Grown Crystal Interface A planar chip electrode formed by a copper electrode was brought into contact with a copper wire having a diameter of 300 μm, Ni plating was formed from a nearby region of the contact place, and an orientation of each growing crystal in an association interface of portions where an angle between a tangent line of the outer periphery of a copper wire and an opposing chip surface is within 15 degrees was measured. A percentage of a case where an orientation difference of associating crystals at the interface is not more than 15 degrees and a case where the orientation difference is more than 15 degrees was measured.

A sample was prepared by adjusting a current density and additive agents. Plating time was adjusted such that a region within a distance of 90 μm from a wire contact portion was joined by plating. A length of the wire was adjusted to be 1 mm for cutout, and a joint strength was measured by a share tester.

As a result, supposing that an average value of the joint strength in a case where a percentage of crystal orientation difference of not more than 15 degrees in a direction perpendicular to the interface is not more than 10% is 10, the strength of samples whose percentages of crystal orientation difference of not more than 15 degrees were 15%, 40%, 55%, and 70% was measured. A result of the respective measurements is shown in the following table.

TABLE 1

| | Percentage of not more than 15 degrees (%) | | | | |
|---|---|---|---|---|---|
| | 10 | 15 | 40 | 55 | 70 |
| Joint strength | 10 | 10.8 | 13 | 20 | 25 |

As apparent from the above result, the joint strength increased as the percentage of crystal orientation difference of not more than 15 degrees increased. In particular, it can be seen that the joint strength dramatically increased after exceeding 50%.

While certain embodiments have been described, these embodiments have been presented by way of example only, and are not intended to limit the scope of the present invention. The novel apparatuses (devices) and methods thereof described herein may be embodied in a variety of other forms; furthermore, various omissions, substitutions and changes in the form of the apparatuses (devices) and methods thereof described herein may be made without departing from the gist of the present invention. The accompanying claims and their equivalents are intended to cover such forms or modifications as would fall within the scope and gist of the present invention.

What is claimed is:

1. An electrode connection structure comprising:
a first electrode of an electrical circuit; and
a second electrode of the electrical circuit that is electrically connected to the first electrode, wherein
the first and second electrodes are oppositely disposed in direct or indirect contact with each other at an at least one contact region,
a plated lamination is formed on a surface near the contact region and opposed surfaces of the first and second electrodes, and
portions of the plated lamination formed on the opposed surfaces of the first and second electrodes in a region other than the contact region are separated, and a portion near the contact region consists only of the plated lamination.

2. The electrode connection structure according to claim 1, wherein contact portions where the first and second electrodes are in direct or indirect contact with each other, are held in a point-like or linear manner.

3. The electrode connection structure according to claim 1, wherein a plating material comprises a metal having a melting point of 700° C. or higher, or an alloy of the metal.

4. The electrode connection structure according to claim 1, wherein
a plating material comprises nickel or a nickel alloy, or copper or a copper alloy, and
a material of each surface of the first and second electrodes to be connected comprises nickel or a nickel alloy, copper or a copper alloy, gold or a gold alloy, or silver or a silver alloy.

5. The electrode connection structure according to claim 1, wherein the first and second electrodes are electrically connected through a spherical or hemispherical conductive terminal, or a lead wire.

6. The electrode connection structure according to claim 1, wherein
the first and second electrodes to be electrically connected, comprise one of a chip electrode and a substrate electrode and the other, respectively, and
the chip comprises an SiC semiconductor, a GaN semiconductor, a power Si semiconductor, a solar cell Si semiconductor, or an LED element.

7. The electrode connection structure according to claim 1, wherein when a chip backside electrode as the first electrode and a substrate electrode as the second electrode are connected with a die bonding structure, a through-hole for circulating a plating solution is formed in the substrate electrode.

8. The electrode connection structure according to claim 1, wherein
the first and second electrodes are directly or indirectly connected with the respective electrodes in a conduction state by solder or low temperature sintered metal, and
a junction is formed by coating the connected portion with plating.

9. The electrode connection structure according to claim 1, further comprising first and second convex electrodes in direct contact with the first and second electrodes across an interposer in between the first and second electrodes, wherein
a plating layer is formed across the interposer in a state where an imaginary line passing through respective centers of the first and second convex electrodes across the interposer is not perpendicular to an electrode plane of the first and/or second electrodes.

10. The electrode connection structure according to claim 1, wherein
at least one of the first and second electrodes comprises a chip electrode, and
at least a side portion of a chip having the chip electrode is coated with an insulating material.

11. The electrode connection structure according to claim 1, wherein the first electrode comprises a first contact region and the second electrode comprises a second contact region, the first contact region and the second contact region indirectly contact with each other.

12. The electrode connection structure according to claim 1, wherein the plated lamination is substantially uniformly formed on the surface near the contact region and opposed surfaces of the first and second electrodes.

13. The electrode connection structure according to claim 1, wherein
the first and second electrodes comprise an electrode between chips or an electrode between a chip and a substrate, and
the tip and/or the substrate are plate-processed with the same sandwiched vertically, in a state where the first and second electrodes are in direct or indirect contact with each other.

14. The electrode connection structure according to claim 13, further comprising a metal body that vertically sandwiches the chip and/or the substrate and fixes the first electrode and second electrodes by elastic force and that serves as a wiring.

15. The electrode connection structure according to claim 1, wherein
in a case where the first electrode and the second electrode are in direct contact with each other, a nearby contact region of the first electrode side is defined as a first contact part and a nearby contact region of the second electrode side is defined as a second contact part, or
in a case where the first electrode and the second electrode are in indirect contact with each other through a conductive terminal, a nearby contact region of the first and second electrodes side is defined as a first contact part and a nearby contact region of the conductive terminal side is defined as a second contact part,
a distance between the first contact part and the second contact part continuously increases in an outside direction of the first and second contact parts from a contact place of the first and second contact parts, and
of a plated structure formed in a region where an angle between the first and second contact parts is within 15 degrees, an interface crystal structure in which an angular difference in crystal orientations at an association interface where crystal that grows from the first contact part and crystal that grows from the second contact part associate is within 15 degrees, is formed by not less than 50% of the entire association interface.

16. The electrode connection structure according to claim 15, wherein
a material of the plating has a crystal structure belonging to a cubical crystal, Electrode connection structure characterized in that said plating material has a, a <100> or <110> oriented crystal orientation to be grown by plating.

17. An electrode connection method of forming the electrode connection structure according to claim 1, comprising:
placing at least portions of the first and second electrodes in direct or indirect contact with each other on the at least one contact region;
plating a periphery of the contact region and the first and second electrodes in a state where a plating solution is circulated in the periphery of the contact region; and
stopping the plating process, in a state where a plated lamination surface nearest to the contact region is in contact with the plating solution, before a void shielded by a surface of the plated lamination formed on the respective first and second electrodes occurs.

18. The electrode connection method according to claim 17, wherein
the first and second electrodes are oppositely disposed in direct or indirect contact with each other through a convex portion, a plated lamination is formed by plating process from a contact region surface of the convex portion and opposed surfaces of the first and second electrodes, and a void is filled by the lamination forming in order from a region near the contact region surface of the convex portion.

\* \* \* \* \*